US009685448B2

(12) United States Patent
Takesako

(10) Patent No.: US 9,685,448 B2
(45) Date of Patent: Jun. 20, 2017

(54) SEMICONDUCTOR DEVICE

(71) Applicant: Micron Technology, Inc., Boise, ID (US)

(72) Inventor: Kazuaki Takesako, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/013,796

(22) Filed: Feb. 2, 2016

(65) Prior Publication Data

US 2016/0163709 A1    Jun. 9, 2016

Related U.S. Application Data

(63) Continuation of application No. 14/310,801, filed on Jun. 20, 2014, now Pat. No. 9,269,716.

(30) Foreign Application Priority Data

Jun. 24, 2013   (JP) .................................. 2013-131720

(51) Int. Cl.
*H01L 23/48*     (2006.01)
*H01L 27/108*    (2006.01)
*H01L 21/768*    (2006.01)

(52) U.S. Cl.
CPC ...... *H01L 27/108* (2013.01); *H01L 21/76816* (2013.01); *H01L 21/76883* (2013.01); *H01L 27/10888* (2013.01); *H01L 27/10894* (2013.01); *H01L 27/10885* (2013.01); *H01L 27/10891* (2013.01)

(58) Field of Classification Search
USPC ......................................................... 257/774
See application file for complete search history.

(56) References Cited

U.S. PATENT DOCUMENTS

| 8,564,058 | B1 * | 10/2013 | Hsieh ................... H01L 29/407 257/330 |
|---|---|---|---|
| 2010/0001327 | A1 | 1/2010 | Kim et al. |
| 2011/0183488 | A1 | 7/2011 | Takaishi |
| 2012/0018802 | A1 | 1/2012 | Liu et al. |

FOREIGN PATENT DOCUMENTS

JP    2011-155064    8/2011

* cited by examiner

*Primary Examiner* — Timor Karimy
(74) *Attorney, Agent, or Firm* — Wells St. John, P.S.

(57) ABSTRACT

Disclosed herein is a method includes: forming first and second cavities, the first cavity having a first width, each of the second cavities having a second width narrower than the first width; forming a first conductive layer buried in the second cavities and formed on bottom and side surface of the semiconductor substrate defined by the first cavity so that a third cavity is defined by the first conductive layer formed on the bottom and side surface of the semiconductor substrate; subjecting an etch back process to the first conductive layer so that a first conductive portion is formed at a bottom corner of the first cavity, further a fourth cavity is formed on the semiconductor substrate uncovered with the first conductive portion in the first cavity; and forming a first insulating layer in the fourth cavity and in the second cavity.

20 Claims, 40 Drawing Sheets

SEMICONDUCTOR DEVICE

RELATED PATENT DATA

This patent resulted from a continuation application of U.S. patent application Ser. No. 14/310,801, filed Jun. 20, 2014, entitled "Method of Manufacturing Semiconductor Device Having Embedded Conductive Line", naming Kazuaki Takesako as inventor, the disclosure of which is incorporated by reference.

BACKGROUND OF THE INVENTION

Field of the Invention

Embodiments of the present invention relate to a semiconductor device and a method of forming the semiconductor device, and particularly to a semiconductor device aimed at preventing short-circuiting of a semiconductor substrate and a contact plug in a peripheral circuit region of a vertical transistor in the semiconductor device containing the vertical transistor, and a method of forming the semiconductor device.

Description of Related Art

In recent years, high integration of semiconductor devices, such as DRAM (dynamic random access memory), has been taking place rapidly. A MOS (metal-oxide semiconductor) transistor that is integrated on a semiconductor device is required to be formed in such a way as to have a smaller surface area. As a MOS transistor that can be formed in high density on the semiconductor substrate, a vertical MOS transistor (pillar transistor) is available. The vertical MOS transistor is a transistor whose gate electrode is formed on a side wall of a columnar semiconductor (pillar semiconductor)

More specifically, in the vertical MOS transistor, a gate electrode of a transistor and an embedded bit line are formed in such a way as to encircle a pillar, which is made by processing an upper portion of the semiconductor substrate and to be at different heights and cross each other at substantially right angles. The gate electrode is a wire that functions as an embedded word line, and extends in one direction (X-direction in this case) and above the embedded bit line. Each embedded bit line extends in a Y-direction that is at a certain angle to the X-direction. Between the pillars that are arranged in the X-direction, embedded bit lines that extend in the Y-direction are formed. Each embedded bit line is shared by a plurality of pillars that are arranged in the Y-direction.

If the semiconductor device is applied to DRAM, a pair of embedded word lines (gate electrodes) may work as a double gate connected to one pillar. In such a case, the embedded bit line is connected only to a one-side pillar. A bottom surface of the embedded bit line is connected to a protective film such as insulator.

The bottom surface of the embedded bit line is insulated from the semiconductor substrate by an insulating film, which is formed on a bottom surface of a groove of the semiconductor substrate. A side surface of the embedded bit line is insulated by a bit insulating film, which is formed on an inner side wall of the groove, and is not connected to a pillar that is on the opposite side of a pillar that is to be connected. Moreover, the embedded bit line is connected to a lower diffusion region via a contact plug (bit contact), which is provided in such a way as to pass through a side surface of an insulating film near a pillar which the embedded bit line is in contact with. Incidentally, without the use of the bit contact, the embedded bit line and the lower diffusion region may be disposed so as to be in direct contact with each other.

In many cases, the semiconductor substrate used for such a semiconductor device is made of p-type silicon. Below a groove of the semiconductor substrate that is formed at the time of making pillars, a diffusion region to which n-type impurities have been added may be formed. This lower diffusion region constitutes a source-drain region of a vertical MOS transistor.

Moreover, above each pillar, an upper diffusion region is formed. The upper diffusion region constitutes a source-drain region of the vertical MOS transistor; impurities have been added to the upper diffusion region, as in the case of the lower diffusion region. On the upper diffusion region, an upper wire of the semiconductor device is provided.

If the semiconductor device is applied to DRAM, on the upper diffusion region, a capacitor (capacitance) is formed via a contact plug (capacitor contact). In many cases, a cylinder-type capacitor that includes a lower electrode, a capacitance insulating film, and an upper electrode is used. The pillars and capacitor contacts each are separated by an interlayer insulating film. Incidentally, without the use of the capacitor contacts, the upper diffusion region and the capacitor or upper wire may be disposed on the upper diffusion region in such a way as to be in direct contact with the upper diffusion region.

As described above, it is clear that one vertical MOS transistor is made up of a lower diffusion region and an upper diffusion region, which function as source-drain regions, a pillar portion, which is between the above regions and is a part of a semiconductor substrate, and a pair of gate electrodes, which are formed so as to face both side walls of the pillar portion.

In Japanese Patent Application Laid-open No. 2011-155064, related technology of the vertical MOS transistor having the above configuration is disclosed. More specifically, Japanese Patent Application Laid-open No. 2011-155064 discloses a technique which makes it possible to reduce the wiring capacitance of the memory cell region and to reduce the wiring resistance in the peripheral circuit region by forming, in a peripheral circuit region having a planar MOS transistor, a periphery upper wire that is thicker than a cell upper wire of a memory cell region having the vertical MOS transistor.

In this kind of vertical MOS transistor, as described above, the gate electrode that serves as the word line, and the bit line are embedded in the semiconductor substrate. Therefore, a contact plug (referred to as a power-supply contact plug, hereinafter) for supplying power to the embedded bit line and the embedded word line need to be formed deeper than those of a planar transistor. If a vertical MOS transistor is used in a memory cell region as in the case of DRAM, parts of the embedded bit line and embedded word line (contact portions) are formed so as to extend in a peripheral region, and the power-supply contact plug is formed in each of the contact portions.

Moreover, in order to prevent an increase in the number of forming steps of the semiconductor device containing the vertical MOS transistors, the power-supply contact plugs for the embedded bit lines and embedded word lines are preferably formed at once by etching or the like. However, because of the above-described relative positional relationship between the embedded bit lines and the embedded word lines, the contact plugs for the embedded bit lines will be different in depth from the contact plugs for the embedded word lines. Therefore, it is important to secure a margin when etching of the power-supply contact plugs and substrate is performed. With the above fact taken into account, in order to prevent short-circuiting of the contact plugs and the semiconductor substrate, a contact portion of the embedded word line and a contact hole in which the power-supply contact plug thereof is formed is actually formed inside an insulating film such as STI (shallow trench isolation).

However, in a process of forming, at once, contact plugs for supplying power to the embedded bit lines and the embedded word lines, because the embedded word lines are formed at a shallower position compared with the embedded bit lines before the process as described above, if etching of a contact hole in which a bit line contact plug is to be formed is performed at a proper depth, that etching could be excessive for a contact hole in which a word line contact plug is to be formed.

The word line contact hole may be formed in the insulating film of STI or the like of a peripheral circuit region in the same way as before. However, the depth of the STI is not enough relative to the depth of the embedded bit lines. Meanwhile, it is not easy to form a deep STI in terms of embedding. Therefore, the problem is that the semiconductor substrate and contact plugs in the semiconductor device might be short-circuited due to lack of a sufficient short margin between a word line contact plug and the semiconductor substrate.

SUMMARY

In one embodiment, there is provided a method of manufacturing a semiconductor device, the method comprising: forming a first cavity and a plurality of second cavities in a semiconductor substrate, the first cavity having a first width, each of the plurality of second cavities having a second width narrower than the first width; forming a first conductive layer buried in the plurality of second cavities and formed on bottom and side surface of the semiconductor substrate defined by the first cavity so that a third cavity is defined by the first conductive layer formed on the bottom and side surface of the semiconductor substrate; subjecting an etch back process to the first conductive layer so that a first conductive portion is formed at a bottom corner of the first cavity and a plurality of second conductive portions are formed at bottoms of the plurality of second cavities, further a fourth cavity is formed on the semiconductor substrate uncovered with the first conductive portion in the first cavity; and forming a first insulating layer in the fourth cavity and in the second cavity.

According to the present invention, the word line contact plug that is in contact with the embedded cell word line is embedded in the first insulating section, which is formed larger in width than in the memory cell region and larger in depth than the bottom surface of the extended section. Accordingly, even if the bit line contact plug and the word line contact plug are formed at once in such a way as to be equal in depth, the depth of the bottom surface of the word line contact plug and the depth of the bottom surface of the first insulating section are sufficiently secured.

As a result, without performing an additional step such as photolithography, a sufficient short margin of the word line contact plug and semiconductor substrate is ensured; it is possible to reliably prevent short-circuiting of the semiconductor substrate and the contact plugs in the semiconductor device.

DETAILED DESCRIPTION OF THE EMBODIMENTS

Hereinafter, a method of forming a semiconductor device to which the present invention has been applied will be described in detail with reference to the accompanying drawings. Incidentally, the drawings used for the following description are intended to describe the configuration of an embodiment of the present invention. The size, thickness, dimensions, and other factors of each portion shown in the diagrams may be different from the dimensional relationship of an actual semiconductor device.

First, the configuration of a semiconductor device of a first embodiment to which the present invention has been applied will be described with reference to FIGS. 1 to 3.

The semiconductor device of the first embodiment is a DRAM, one example of the semiconductor device, to which the present invention has been applied. Turning to FIG. 1, the semiconductor device includes a memory cell region R1, in which a plurality of memory cells are formed; and a peripheral circuit region R10, in which peripheral circuits are formed to take control of voltage applied to an embedded cell bit line 5a and an embedded cell word line 11 in the memory cell region R1, as well as to perform other processes.

Figure 1:
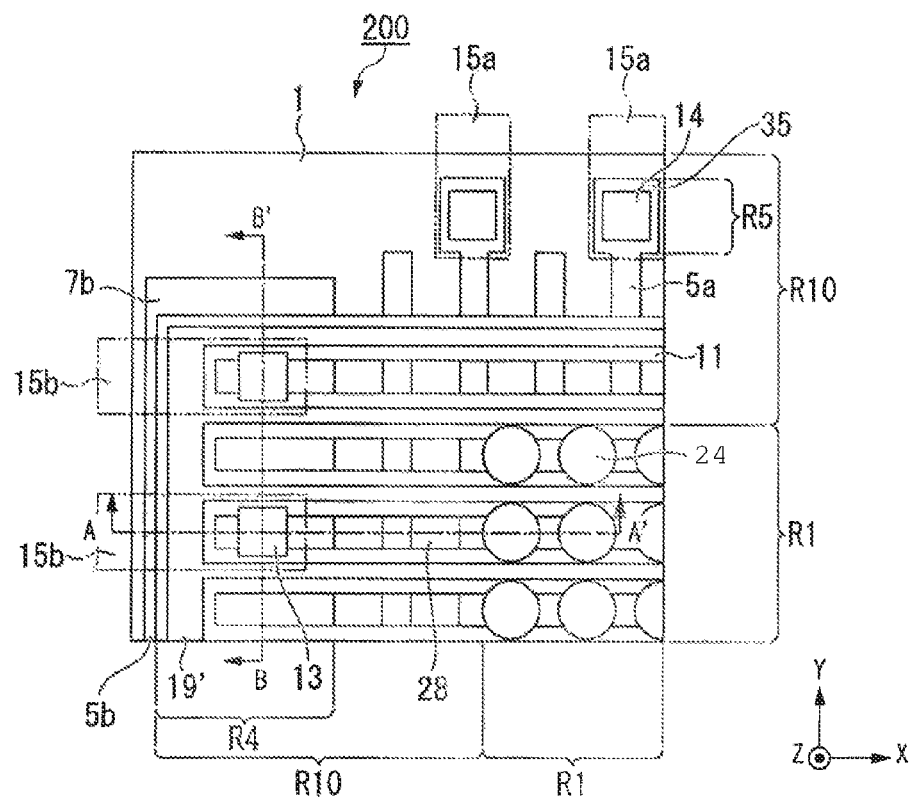
FIG. 1 is a plan view indicative of an embodiment of a configuration of a semiconductor device according to the present invention.
Figure 2:
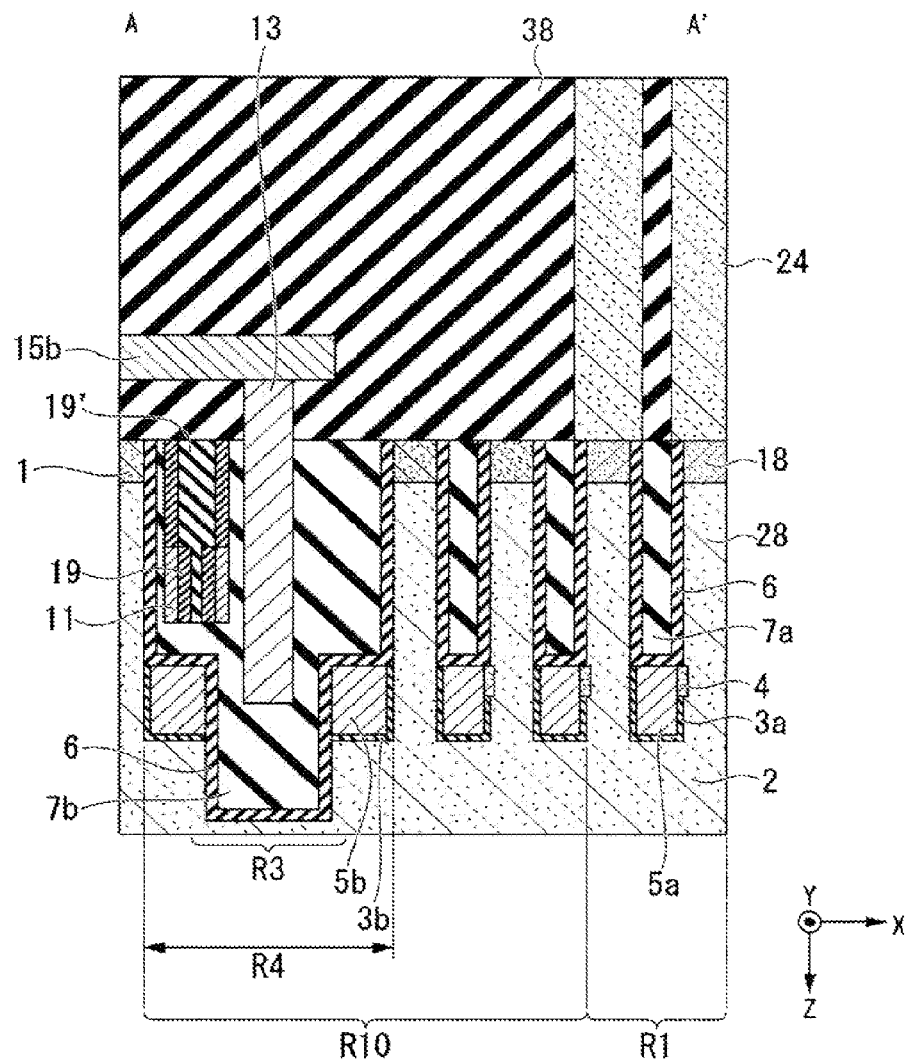
FIG. 2 is a sectional view taken along a line A-A' shown in FIG. 1.

Turning to FIGS. 1 and 2, the memory cell region R1 of the DRAM. 200 includes a plurality of silicon pillars 28, which serve as channels of transistors (referred to as cell transistors, hereinafter) that are formed in each memory cell. The silicon pillars 28 each are formed in a region between cavities made by digging a semiconductor substrate 2; the silicon pillars 28 are arranged in a regular manner in planar view.

The semiconductor substrate 2 is made of p-type semiconductor silicon. In portions above the silicon pillars in the semiconductor substrate 2, impurity diffusion regions 18 (capacitor contacts) to which n-type impurity dopants have been added are formed.

In the DRAM 200, a gate electrode 11 (embedded cell word line) of a transistor and an embedded cell bit line 5a extend in such a way as to encircle each silicon pillar 28 and to be at different heights and cross each other at substantially right angles. The gate electrode 11 extends in one direction and above the level of the embedded cell bit line 5a. An end portion of the embedded cell bit line 5a goes beyond the memory cell region R1 and extends into the peripheral circuit region R10. In the peripheral circuit region R10, a bit line contact section R5 (enlarged section) that is one end portion of the embedded cell bit line 5a and is made larger in width than the embedded cell bit line 5a that is in the memory cell region R1 is provided. Between the silicon pillars 28 of the memory cell region R1, the embedded cell bit lines 5a are formed so as to extend in a Y-direction (first direction).

In the DRAM 200, a cell transistor includes a silicon pillar 28, which serves as a channel of the transistor; one embedded cell bit line 5a, which is connected to the silicon pillar 28; and a pair of gate electrodes 11, which are disposed on both side walls of the silicon pillar 28 in such a way as to face each other through a gate insulating film 12 (which will be described with reference to FIG. 24 and the like) and which are connected to each other in the peripheral circuit region R10.

The embedded cell bit line 5a is made of conductive material. More specifically, for example, the embedded cell bit line 5a is made of titanium nitride (TiN), tungsten (W), or a laminated film of those metal films. The material of the gate electrodes 11 is not specifically limited as long as the gate electrodes 11 are made of conductive material.

In the DRAM 200, the two gate electrodes 11 that are disposed between the adjacent silicon pillars 28 are separated by a liner film 19 and a word interlayer insulating film 19'. The liner film 19 is formed so as to cover a side surface that is not in contact with the gate insulating film 12, and a side surface of the silicon pillar 28. The word interlayer insulating film 19' is formed so as to fill the inside of the liner film 19; an upper surface thereof is formed so as to be flush with an upper surface of the silicon pillar 28. Moreover, in the DRAM 200, the two gate electrodes 11 make up a double-gate structure in which the two gate electrodes 11 are connected to both sides of one silicon pillar. However, the embedded cell bit line 5a is connected only to one side of the silicon pillar 28. The arrangement of the liner film 19, the word interlayer insulating film 19', and the gate insulating film 12, and the like will be described later together with a method of forming the DRAM 200.

In the DRAM 200, as shown in FIG. 2, on an inner wall of a bottom portion of a cavity formed in the semiconductor substrate 2, a bit insulating film 3a, which is made of a thermal oxide film, is formed. The embedded cell bit line 5a, which is formed so as to be surrounded by the bit insulation film 3a, is connected to the semiconductor substrate 2 via a cell bit contact 4.

The cell bit contact 4 is made of conductive material. The cell bit contact 4 is provided on a side wall of the cavity formed in the semiconductor substrate 2 in such a way as to penetrate the bit insulating film 3a. The conductive material used for the cell bit contact 4 includes, for example, polysilicon to which n-type impurity dopants, such as arsenic (As) or phosphorus (P), have been added.

Incidentally, in a portion of the semiconductor substrate 2 that is in contact with the cell bit contact 4, an impurity diffusion region (not shown) may be provided. This impurity diffusion region constitutes a source-drain region of a cell transistor, and is made by adding impurities to the portion of the semiconductor substrate 2 that is in contact with the cell bit contact 4. The impurities include n-type impurity dopants, such as arsenic or phosphorus.

The embedded cell bit line 5a is insulated from the semiconductor substrate 2 by the bit insulating film 3a, and is not connected to a silicon pillar 28 that is on the opposite side of the to-be-connected silicon pillar 28. On an inner wall of a portion of the cavity that is above the embedded cell bit line 5a, a liner film 6, which is made of silicon nitride film or the like, is formed. A bit interlayer insulating film 7a, which is made of silicon oxide film or the like, is formed so as to fill the inside of the liner film 6.

As shown in FIG. 2, above each silicon pillar 28, an impurity diffusion region 18 is formed. The impurity diffusion region 18 constitutes a source-drain region of a cell transistor, and is made of a silicon film including impurities formed in a portion that is located above the silicon pillar 28 in the semiconductor substrate 2. The impurities include n-type impurity dopants, such as arsenic or phosphorus.

Above the impurity diffusion region 18, a capacitor 24 is formed. In the case of the configuration shown in FIG. 2, the impurity diffusion region 18 is in direct contact with the capacitor 24. However, a contact plug may be formed between the impurity diffusion region 18 and the capacitor 24, and the impurity diffusion region 18 and the capacitor 24 may be connected via the contact plug.

The capacitor 24 has a cylinder-type configuration, and includes a lower electrode, a capacitance insulating film, and an upper electrode, which are not shown in the diagrams. Incidentally, the configuration of the capacitor 24 is not limited to the cylinder type; trench-type, stack-type, and other types are available as long as those types are suitable for typical DRAMS.

As described above, the embedded cell bit line 5a, the impurity diffusion region 18, which is connected to the capacitor 24, and a pair of gate electrodes 11, which are disposed on both side walls of the silicon pillar 28 at almost the central position of the depth direction between the embedded cell bit line 5a and the impurity diffusion region 18 in such a way as to face each other, constitute one vertical cell transistor.

Turning to FIG. 1, in the peripheral circuit region R10 of the DRAM 200, a word-line contact section R4 and the bit line contact section R5 are formed.

The embedded-word-line contact section R4 extends in the same direction as the embedded cell bit line 5a. The embedded-word-line contact section R4 is greater in width than the embedded cell bit line 5a. Moreover, the embedded-word-line contact section R4 is provided so as to overlap with a connection portion of an end portion of the gate electrode 11 in planar view.

Moreover, as shown in FIG. 2, on the embedded-word-line contact section R4, an insulating section R3 (first insulating section) is provided in an X-direction (second-direction) central portion in such a way as to go deeper than a surrounding area and extend in the Y-direction.

The inner wall of the embedded-word-line contact section R4 including the insulating section R3, is covered with the liner film 6. The inside thereof is filled with a peripheral word interlayer insulation film 7b, which is made of silicon oxide film or the like.

As shown in FIGS. 1 and 2, the embedded-word-line contact section R4 is formed so as to overlap with the connection portion of the end portion of the gate electrode 11. Therefore, the connection portion which extends in the Y-direction and which includes the gate electrode 11, the liner film 19, and the word interlayer insulating film 19' is embedded in the peripheral word interlayer insulation film 7b.

An embedded peripheral bit line 5b is formed on a side of the insulating section R3 in a lower portion of the embedded-word-line contact section R4 in such a way as to extend in the Y-direction. A bit insulation film 3b is formed between the embedded peripheral bit line 5b and the semiconductor substrate 2.

Figure 3:
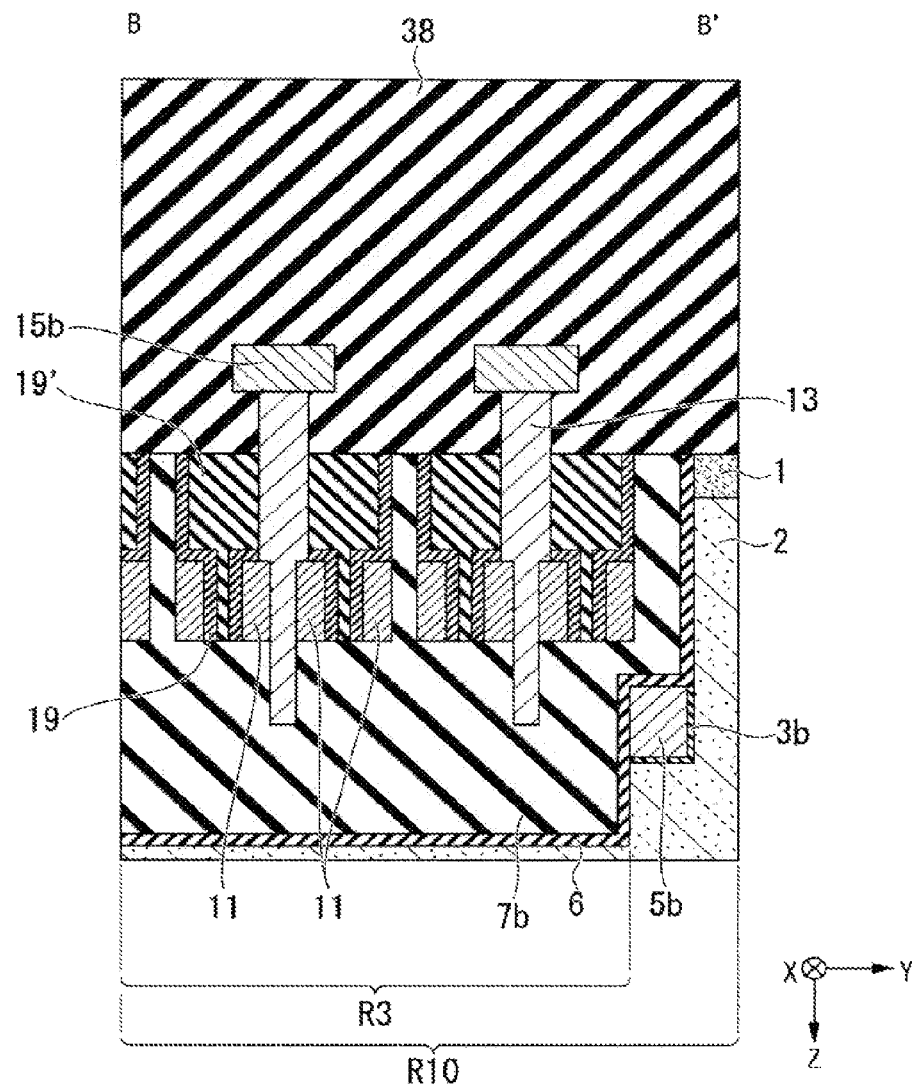
FIG. 3 is a sectional view taken along a line B-B' shown in FIG. 1.

Turning to FIGS. 1 to 3, a cell word line contact plug 13 (word line contact plug) is provided in the peripheral word interlayer insulation film 7b in such a way that a deepest portion thereof is placed inside the insulating section R3 of the embedded-word-line contact section R4. The cell word line contact plug 13 is in contact with a side surface of the gate electrode 11 that is in contact with the silicon pillar 28 via the gate insulating film 12 in the memory cell region R1. Moreover, the depth of the cell word line contact plug 13 is substantially equal to that of a cell bit line contact plug 14 (bit line contact plug), which will be described later; or the cell word line contact plug 13 reaches the depth of an upper surface of an enlarged end portion 35 of the embedded cell bit line 5a (the embedded cell bit line 5a in the bit line contact section R5); or the cell word line contact plug 13 goes so deep that the cell word line contact plug 13 can be placed inside the enlarged end portion 35 of the embedded cell bit line 5a. The cell word line contact plug 13 goes deeper than a position where the gate electrode 11 is formed. A bottom surface of the cell word line contact plug 13 is formed at a shallower position compared with a bottom surface of the insulating section R3. The difference in height between the bottom surface of the insulating section R3 and the bottom surface of the cell word line contact plug 13 is preferably determined taking into account a short margin of the DRAM 200 and the like. It is more preferred that the difference be set sufficiently larger than the short margin. Accordingly, on the basis of the depth of the insulating section R3 and the short margin, the range of appropriate depth of the cell word line contact plug 13 is determined. The cell word line contact plug 13 may be made of tungsten or the like.

An upper portion of the cell word line contact plug 13 extends above the semiconductor substrate 2. A word line upper wire 15b is formed so as to come in contact with an upper surface of the cell word line contact plug 13. According to this configuration, the word line upper wire 15b is electrically connected to the gate electrode 11, which functions as a word line, via the cell word line contact plug 13. Voltage from the word line upper wire 15b is therefore applied to the gate electrode 11.

Incidentally, as shown in FIG. 1, in the Y-direction, the peripheral word interlayer insulation films 7b between the gate electrodes 11 in the embedded-word-line contact section R4 are alternately provided with the cell word line contact plugs 13. This configuration ensures a sufficient distance in the Y-direction between the cell word line contact plugs 13, thereby preventing the cell word line contact plugs 13 from contacting each other. As for a portion between the gate electrodes 11 where no cell word line contact plugs 13 are formed in FIG. 1, a cell word line contact plug 13 is formed between gate electrodes 11 in an embedded-word-line contact section R4 that is on the opposite side (not shown) in the X-direction of the embedded-word-line contact section R4 shown in FIG. 1. However, if the contact between the cell word line contact plugs 13 can be reliably prevented, the cell word line contact plugs 13 may be formed only in one embedded-word-line contact section R4 in the X-direction.

As shown in FIG. 1, the bit line contact section R5 is connected to one end portion of the embedded cell bit line 5a that is formed so as to extend into the peripheral circuit region R10 in the Y direction. In the X-direction (or direction perpendicular to a direction in which the embedded cell bit line 5a extends), the width of the bit line contact section R5 is made greater than the width of the embedded cell bit line 5a in the memory cell region R1.

As shown in FIG. 2, on the inner wall of the bottom portion of the bit line contact section R5, the bit insulating film 3a, which is made of a thermal oxide film, is formed. The same conductive material as that of the embedded cell bit line 5a is formed in the bit line contact section R5 so as to be surrounded by the bit insulating film 3a. In this manner, the enlarged end portion 35 of the embedded cell bit line 5a is formed.

Above the enlarged end portion 35 of the embedded cell bit line 5a, as in the case of the embedded cell bit line 5a, the liner film 6 and the bit interlayer insulating film 7a are formed.

Moreover, a cell bit line contact plug 14 that is in contact with an upper surface of the enlarged end portion 35 of the embedded cell bit line 5a is provided so as to penetrate the liner film 6 and the bit interlayer insulating film 7a. A portion of the cell bit line contact plug 14 may be provided inside the enlarged end portion 35 of the embedded cell bit line 5a. The cell bit line contact plug 14 may be made of tungsten or the like. An upper portion of the cell bit line contact plug 14 extends above the semiconductor substrate 2; a bit line upper wire 15a is formed in such a way as to come in contact with an upper surface of the cell bit line contact plug 14. In this configuration, the bit line upper wire 15a is electrically connected to the embedded cell bit line 5a via the cell bit line contact plug 14 and the bit line contact section R5. Voltage from the bit line upper wire 15a is therefore applied to the embedded cell bit line 5a.

Incidentally, as shown in FIG. 1, in the Y-direction, the embedded cell bit lines 5a are alternately provided with the enlarged end portions 35 and the cell bit line contact plugs 14 in the peripheral circuit region R10. This configuration prevents the cell bit line contact plugs 14 from coming in contact with each other in the X direction. As for the embedded cell bit lines 5a in which neither enlarged end portion 35 nor cell bit line contact plug 14 is formed in FIG. 1, an enlarged end portion 35 and a cell bit line contact plug 14 are formed in a peripheral circuit region R10 that is on the opposite side (not shown) in the Y-direction of the peripheral circuit region R10 across the memory cell region R1. However, if a sufficient distance between the cell bit line contact plugs 14 can be ensured to prevent the contact, the enlarged end portion 35 and the cell bit line contact plug 14 may be formed in an end portion of the Y-direction same side of the embedded cell bit line 5a in the Y-direction.

Above portions of the semiconductor substrate 2 that correspond to the memory cell region R1 and peripheral circuit region R10 of the DRAM 200, an upper interlayer insulating film 38 may be provided in such a way as to cover: the cell word line contact plug 13 and the cell bit line contact plug 14, which protrude from the semiconductor substrate 2; the bit line upper wire 15a and the word line upper wire 15b; and the capacitor 24.

A method of forming the DRAM 200 shown in FIGS. 1 to 3 will be described with reference to FIGS. 4 to 40.

Figure 4:
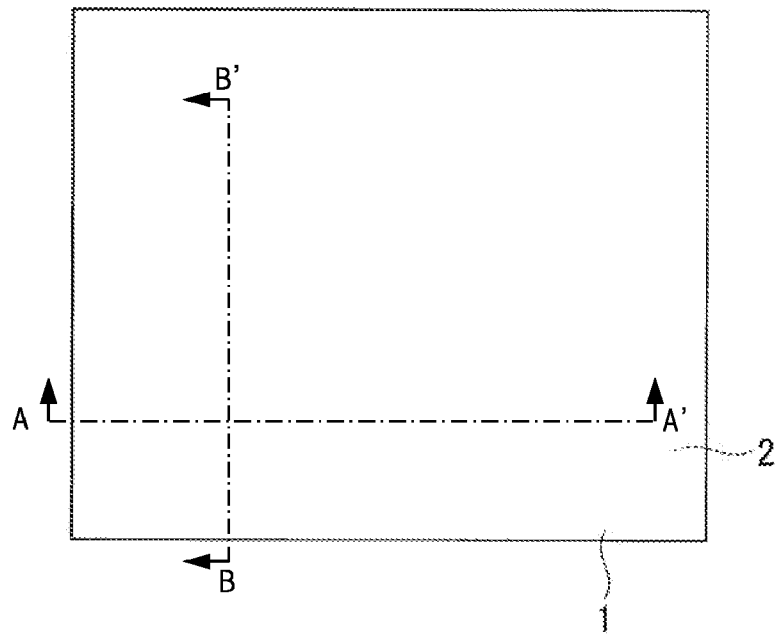
FIG. 4 is a plan view indicative of an embodiment of one process in a method of forming a semiconductor device according to a first embodiment of the present invention.
Figure 5:
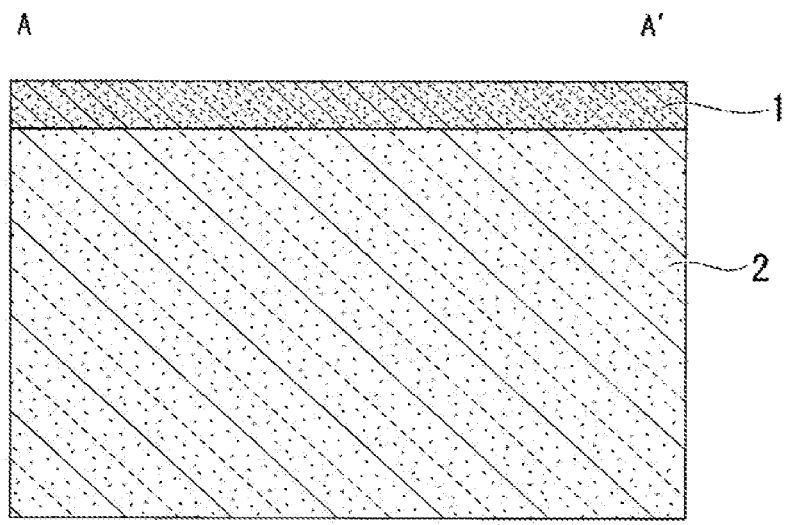
FIG. 5 is a sectional view taken along a line A-A' shown in FIG. 4.
Figure 6:
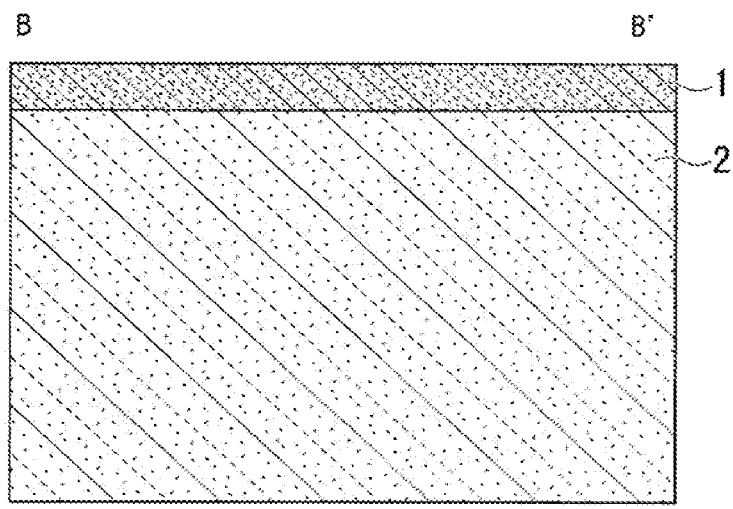
FIG. 6 is a sectional view taken along a line B-B' shown in FIG. 4.

First, as shown in FIGS. 4 to 6, on a surface of the semiconductor substrate 2, a hard mask film 1 that is made of silicon nitride film is formed. For example, CVD (chemical vapor deposition) method can be used to form the hard mask film 1. Then, on the hard mask film 1, a resist film (not shown) is formed. The resist film is used as a mask to perform patterning of the hard mask film 1, in order to form the embedded cell bit line 5a, the embedded-word-line contact section R4, and the bit line contact section R5.

Figure 7:
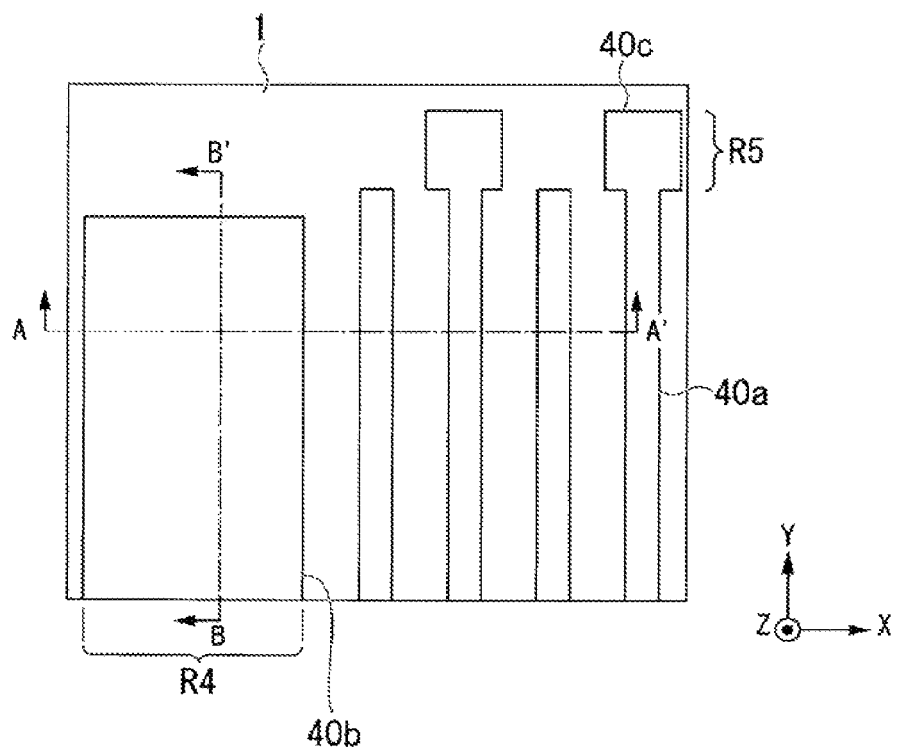
FIG. 7 is a plan view indicative of an embodiment of one process in the method of forming the semiconductor device according to the first embodiment of the present invention.

During that process, as shown in FIG. 7, the patterning of the hard mask film 1 is performed in such a way that the X-direction width of the embedded-word-line contact section R4 is far wider than the X-direction width of the embedded cell bit line 5a. The size of the contact portion of the gate electrode 11, which will be formed later, and the width of the cell word line contact plug 13 are preferably taken into account in setting the X-direction width of the embedded-word-line contact section R4.

Moreover, the patterning of the hard mask film 1 is performed in such a way that the X-direction width of the bit line contact section R5 is wider than the X-direction width of the embedded cell bit line 5a. The width of the cell bit line contact plug 14, which will be formed later, is preferably taken into account in setting the X-direction width of the embedded cell bit line 5a.

The bit line contact sections R5 are preferably formed in such a way that the end portions of the adjacent embedded cell bit lines 5a that extend in the Y-direction are alternately provided with the bit line contact sections R5. This configuration can prevent the adjacent bit line contact sections R5 from coming in contact with each other. This configuration may be unnecessary if the distance between the embedded cell bit lines 5a is sufficiently greater than the X-direction width of the bit line contact sections R5.

Figure 8:
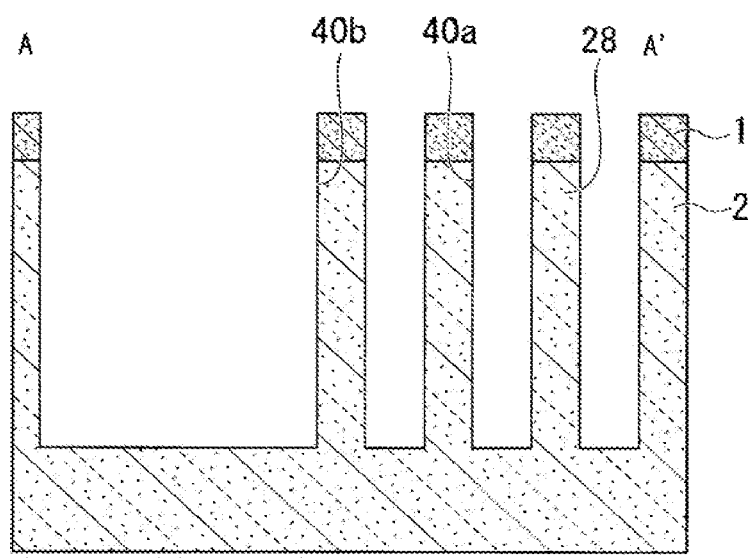
FIG. 8 is a sectional view taken along a line A-A' shown in FIG. 7.
Figure 9:
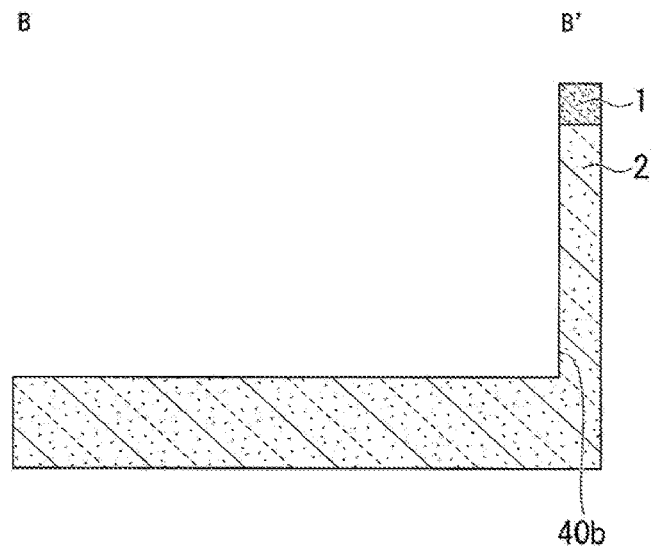
FIG. 9 is a sectional view taken along a line B-B' shown in FIG. 7.

Then, the hard mask film 1 is used as a mask to perform anisotropic dry etching of the semiconductor substrate 2, thereby forming cavity sections 40a, 40b, and 40c as shown in FIGS. 7 to 9. The cavity sections 40a, 40b, and 40c are cavities that are used to form the embedded cell bit line 5a, the embedded-word-line contact section R4, and the bit line contact section R5. At this time, as shown in FIG. 8, silicon pillars 28 are formed in regions between the cavity sections 40a, 40b, and 40c. As for the anisotropic dry etching of the semiconductor substrate 2, for example, a reactive ion etching (RIE: Reactive Ion Etching) method involving inductively coupled plasma (ICP: Inductively Coupled Plasma) can be used.

Figure 10:
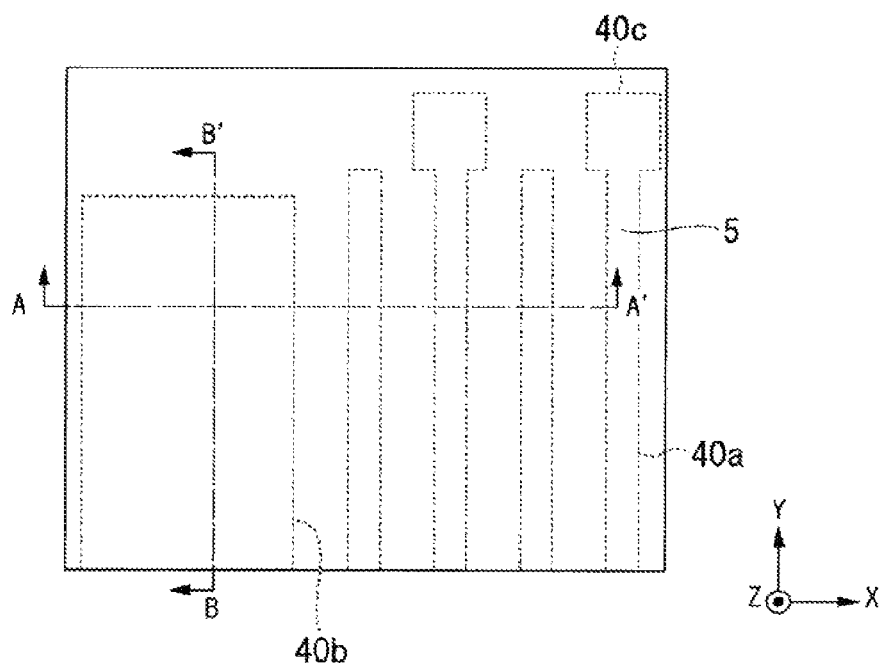
FIG. 10 is a plan view indicative of an embodiment of one process in the method of forming the semiconductor device according to the first embodiment of the present invention.
Figure 11:
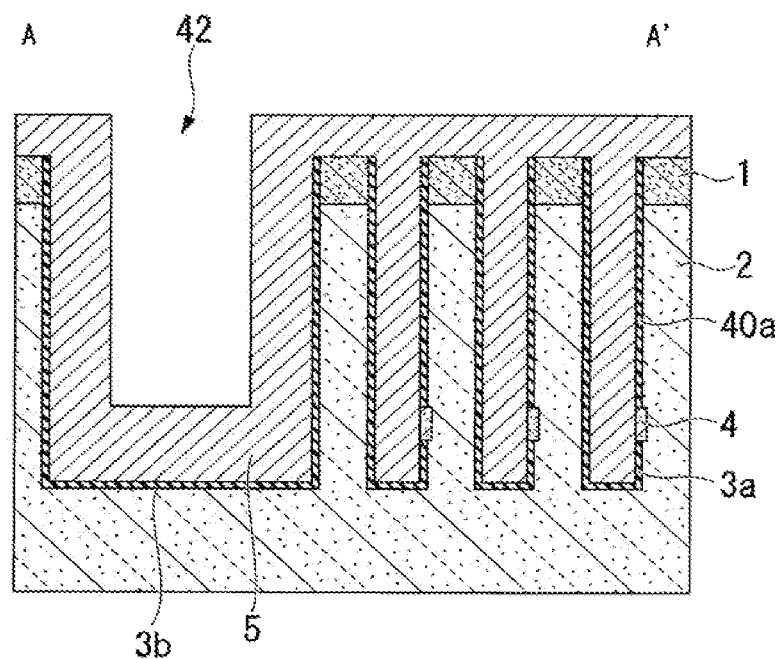
FIG. 11 is a sectional view taken along a line A-A' shown in FIG. 10.
Figure 12:
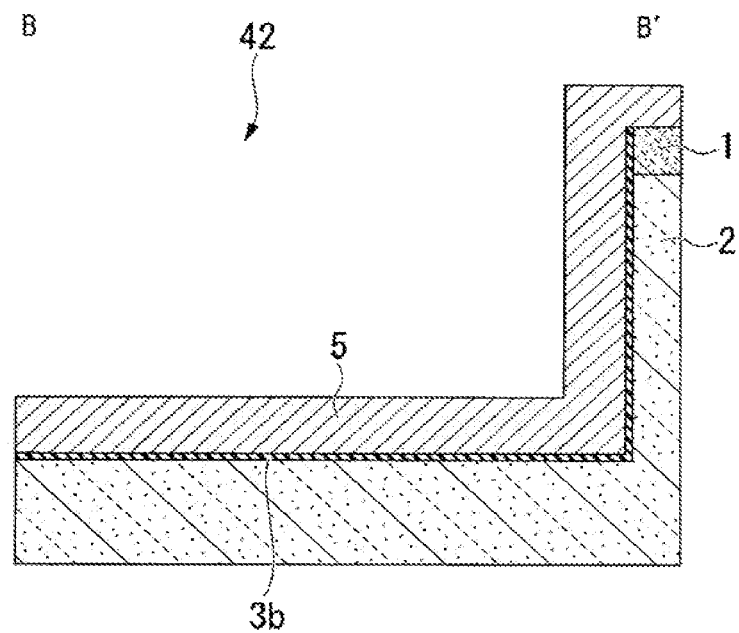
FIG. 12 is a sectional view taken along a line B-B' shown in FIG. 10.

Then, as shown in FIGS. 10 to 12, the bit insulating films 3a and 3b that are made of silicon oxide film are formed in such a way as to cover the inner walls of the cavity sections 40a, 40b, and 40c. As for the bit insulating films 3a and 3b, RTO (rapid thermal oxidation) film, ISSG (in-situ steam generation) film, and the like are available.

Then, as shown in FIG. 11, a portion of the bit insulating film 3 that is formed on the side surface of the cavity section 40a is removed to form a cell bit contact 4 that is made of conductive film. The material of the conductive film used for the cell bit contact 4 may be an impurity-doped polysilicon that is doped with a n-type semiconductor such as arsenic (As) or phosphorus (P).

As for a method of forming the cell bit contact 4, more specifically, an impurity-doped polysilicon film, which is the material of the cell bit contact 4, is formed in such a way as to fill the space surrounded by the bit insulating film 3 of the groove section 40a. Then, in accordance with the position where the cell bit contact 4 is formed, etching-back of the impurity-doped polysilicon film is performed.

Then, in the space above the impurity-doped polysilicon film, a silicon nitride film (not shown) is formed by the CVD method. A chemical solution or the like is used to remove a bottom surface of the silicon nitride film and an upper portion of the impurity-doped polysilicon film. As a result, the bit insulating film 3 of a portion where the cell bit contact 4 is to be formed, and the bit insulating film 3 of the cavity portion 40a that faces the above portion are exposed.

Then, a titanium nitride film is formed in such a way as to cover the exposed bit insulating film 3, the silicon nitride film that is formed on the bit insulating film 3, and the upper surface of the impurity-doped polysilicon film. Etching-back of an upper portion thereof is performed, a silicon oxide film is formed in such a way as to be embedded in the cavity portion 40a, and etching-back of an upper portion of the silicon oxide film is performed to the extent that the titanium nitride film is not exposed.

Then, a mask film that is made of cobalt silicon or the like is formed in such a way as to cover the silicon oxide film formed inside the cavity portion 40a, and the exposed silicon nitride film. From a point that is diagonally above the mask film, ion implantation is performed to a half of the mask film that is on the opposite side from the side surface of the cavity portion 40a where the cell bit contact 4 is to be formed. Then, dry-etching is performed to remove a portion of the mask film to which the ion implantation is not performed, and the silicon oxide film below that mask film. As a result, only an upper portion of the titanium nitride film on the side surface of the cavity portion 40a where the cell bit contact 4 is to be formed is exposed. A chemical solution or the like is used to remove the titanium nitride film on the side surface of the cavity portion 40a where the cell bit contact 4 is to be formed. All the silicon oxide film inside the cavity portion 40a that is exposed at this time is removed. As a result, the side surface of the silicon pillar 28 of the portion where the cell bit contact 4 of the cavity portion 40a is to be formed is exposed.

After that, the remaining titanium nitride film is removed, and an impurity-doped polysilicon film is embedded in the cavity portion 40a. As a result, the impurity-doped polysilicon film is embedded between the bit insulating film 3a that is in contact with the side surface of the exposed silicon pillar 28, and the silicon nitride film; and the impurity-doped polysilicon film is embedded inside the cavity portion 40a. Then, dry-etching is performed to remove only the impurity-doped polysilicon film inside the cavity portion 40a.

The above processes form the cell bit contact 4, as shown in FIG. 11, only on one side surface of the cavity section 40a that is in contact with the silicon pillar 28. After that, the silicon nitride film remaining in the cavity section 40a is removed.

Then, as shown in FIGS. 10 to 12, a conductive film 5 of a predetermined thickness, which is the material of the embedded cell bit line, is formed in the cavity sections 40a, 40b, and 40c. As described above, the X-direction width of the cavity section 40b is far wider than the X-direction width of the cavity sections 40a and 40c. Accordingly, when forming the conductive film 5 with almost the same film thickness in the cavity sections 40a, 40b, and 40c, as shown in FIG. 11, the film thickness of the conductive film 5 is set so that the inside of the cavity sections 40a and 40c is filled with the conductive film 5, the bottom surface and Y-direction side surfaces of the cavity section 40b are covered with the conductive film 5, and a cavity 42 is formed in the cavity section 40b and surrounded by the conductive film 5. As for a method by which the conductive film 5 is embedded, CVD method is available. Moreover, the conductive film 5, which is the material of the embedded cell bit line, may be made of tungsten (W), or an impurity-doped silicon that is doped with a n-type semiconductor, or the like.

Then, etching-back of the conductive film 5 for the embedded cell bit lines is performed by dry-etching-back, thereby removing the conductive film 5 above the hard mask film 1. Furthermore, a portion of the conductive film 5 that is above the cell bit contact 4 of the cavity section 40a is removed. At this time, the etching-back is performed in such a way that the conductive film 5 embedded in the cavity section 40c of the bit line contact section R5 is substantially equal in thickness to that of the conductive film 5 of the cavity section 40a.

Figure 13:
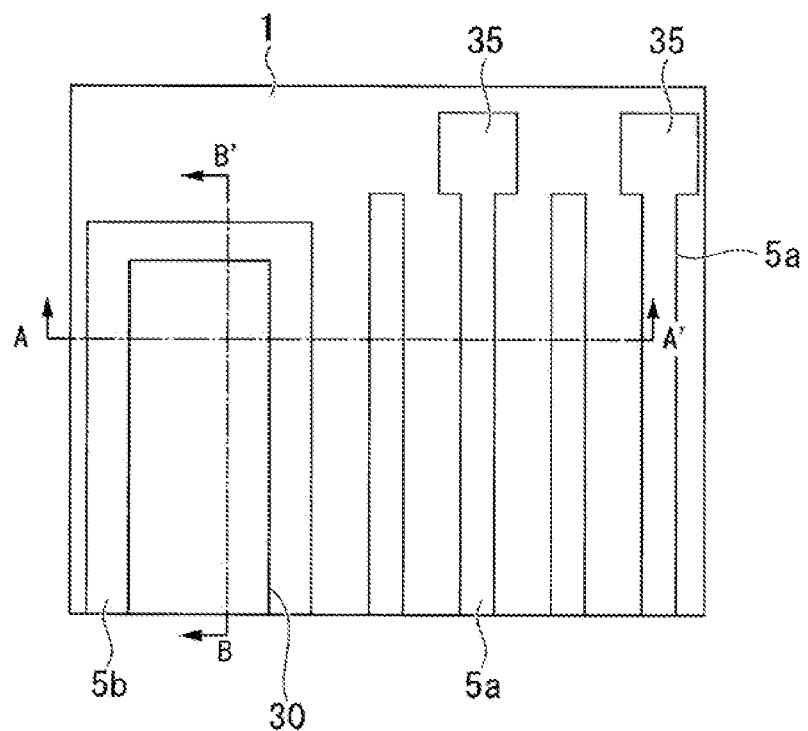
FIG. 13 is a plan view indicative of an embodiment of one process in the method of forming the semiconductor device according to the first embodiment of the present invention.
Figure 14:
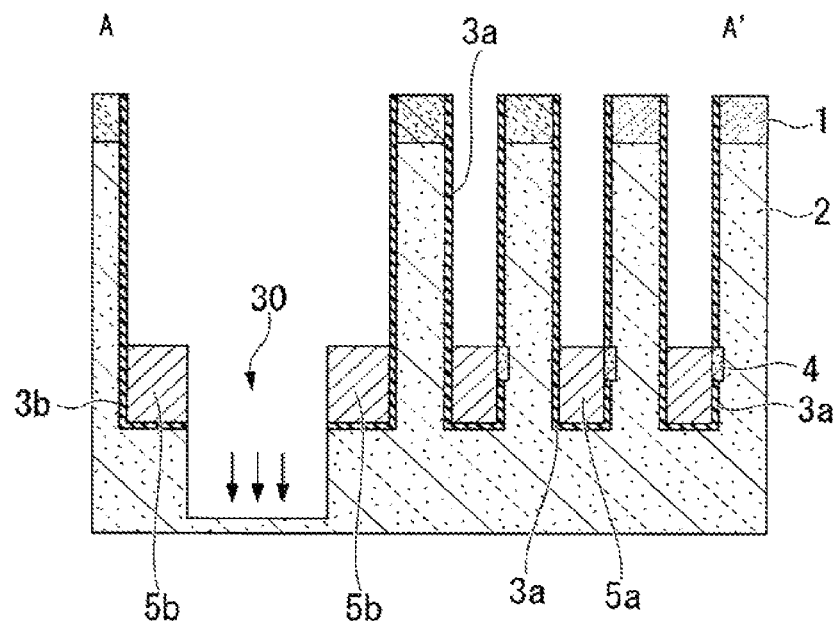
FIG. 14 is a sectional view taken along a line A-A' shown in FIG. 13.
Figure 15:
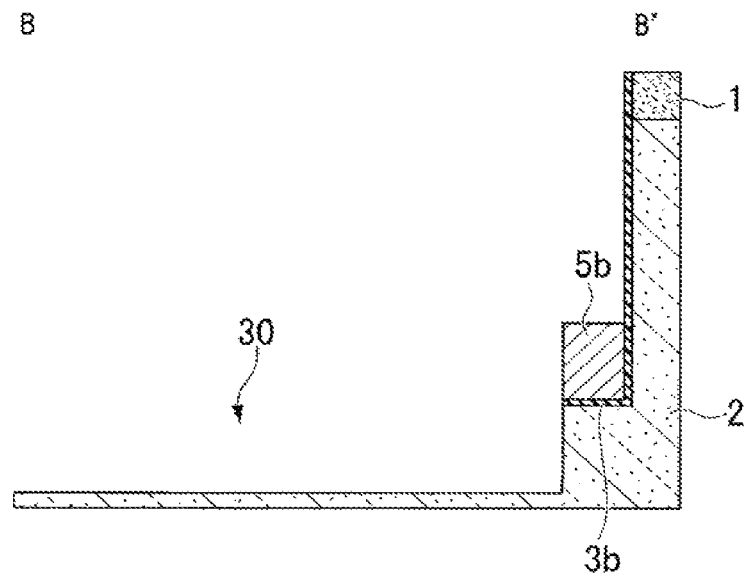
FIG. 15 is a sectional view taken along a line B-B' shown in FIG. 13.

In the cavity section 40b of the embedded-word-line contact section R4, etching-back of an upper portion of the conductive film 5 that is formed on the side faces of the cavity section 40b is performed, and the conductive film 5 is left in the bottom section in such a way as to be substantially equal in thickness to the conductive film 5 of the cavity section 40a. The conductive film 5 below the cavity 42 is completely etched-back, and the semiconductor substrate 2 is exposed much earlier than in the other cavity sections. Therefore, the semiconductor substrate 2 is etched in a self-aligned manner and is recessed. As a result, a recess section 30 shown in FIGS. 13 to 15 is formed.

By this process, the embedded cell bit line 5a can be formed in the cavity section 40a of a region corresponding to the memory cell region R1 shown in FIG. 1, the enlarged end portion 35 (enlarged portion) of the embedded cell bit line 5a can be formed in the cavity section 40c of the bit line contact section R5 of the peripheral circuit region R10. Moreover, in the cavity section 40b of the embedded-word-line contact section R4 of the peripheral circuit region R10, the embedded peripheral bit line 5b can be formed.

Figure 16:
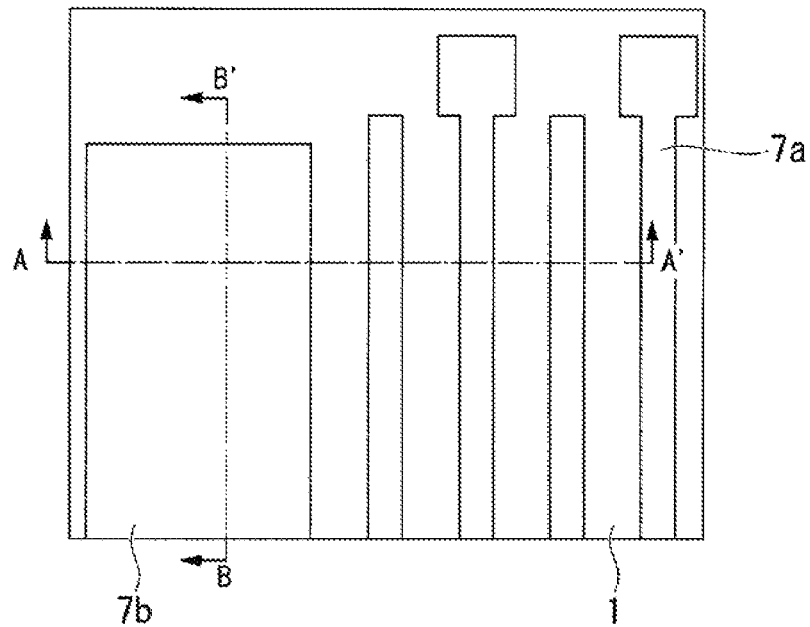
FIG. 16 is a plan view indicative of an embodiment of one process in the method of forming the semiconductor device according to the first embodiment of the present invention.
Figure 17:
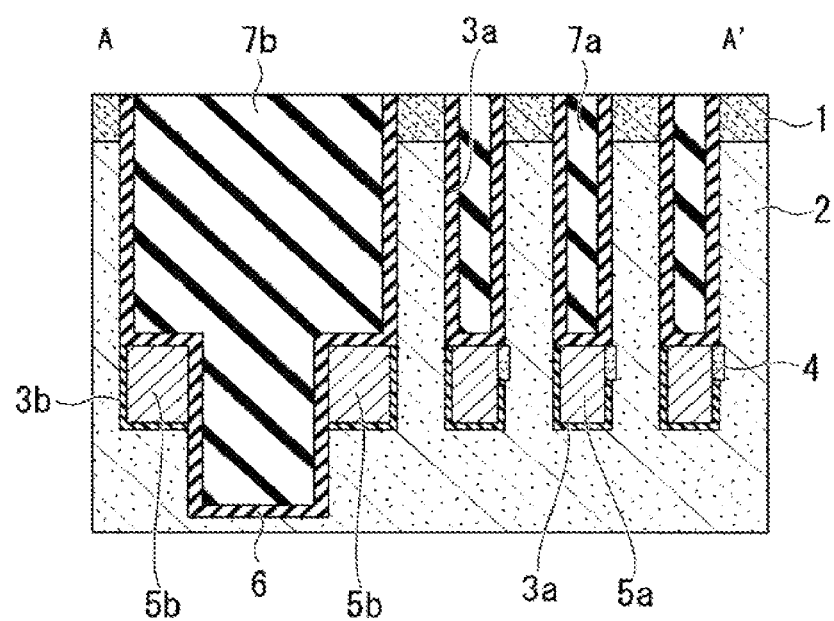
FIG. 17 is a sectional view taken along a line A-A' shown in FIG. 16.
Figure 18:
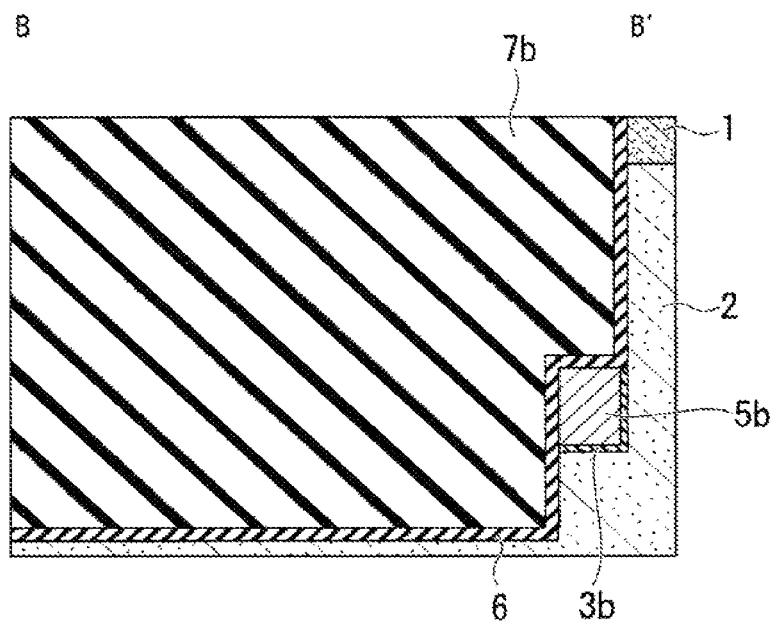
FIG. 18 is a sectional view taken along a line B-B' shown in FIG. 16.

Then, as shown in FIGS. 16 to 18, on the exposed surfaces of the cavity sections 40a, 40b, and 40c, the liner film 6 is formed. The liner film 6 may be made of a silicon oxynitride (SiON) film, a silicon nitride film (SiN), or a laminated film of those films.

Then, in each of the cavity sections 40a, 40b, and 40c, an insulating film is embedded into a space surrounded by the liner film 6. As a result, the bit interlayer insulating film 7a is formed in the cavity sections 40a and 40c, and the peripheral word interlayer insulation film 7b is formed in the cavity section 40b. As for the insulting film used for forming the bit interlayer insulating film 7a and the peripheral word interlayer insulation film 7b, SOD (spin on dielectric) film or HDP (high density plasma) film of silicon oxide is available. After the liner film. 6 and the insulating film of the bit interlayer insulating film 7a and peripheral word interlayer insulation film 7b are formed, the upper portions of those insulating films may be polished and removed, if necessary, by CMP (chemical mechanical polishing) method until an upper surface of the hard mask film 1 on the semiconductor substrate 2 is exposed. Even when any of the formation methods is used, the liner film 6 and the bit interlayer insulating film 7a and the peripheral word interlayer insulation film 7b are formed in such a way that the hard mask film 1 is flush with the upper surface of each insulating film.

Figure 19:
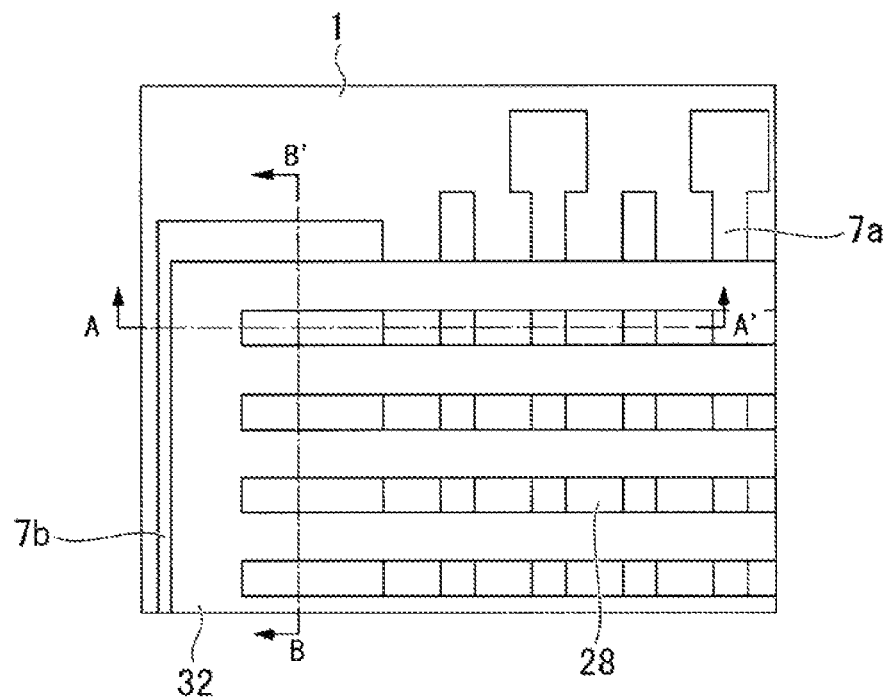
FIG. 19 is a plan view indicative of an embodiment of one process in the method of forming the semiconductor device according to the first embodiment of the present invention.
Figure 20:
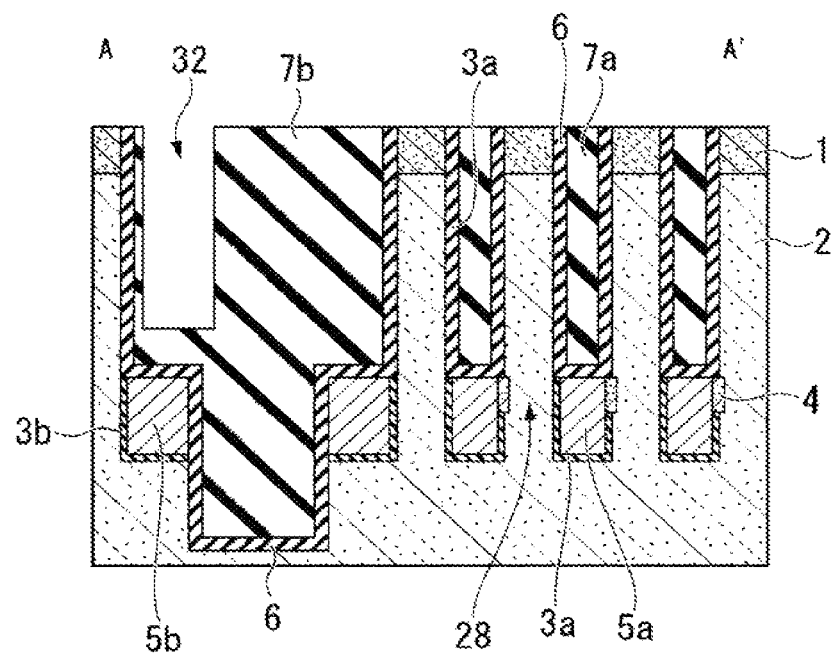
FIG. 20 is a sectional view taken along a line A-A' shown in FIG. 19.
Figure 21:
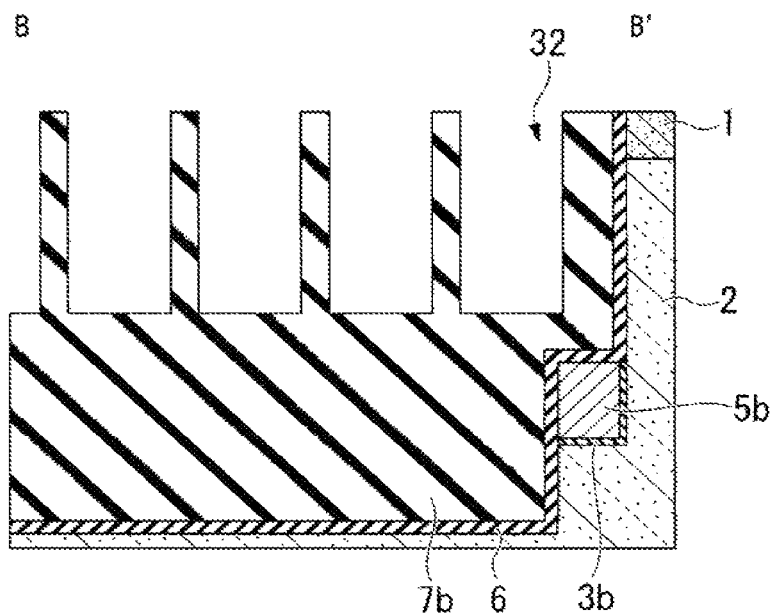
FIG. 21 is a sectional view taken along a line B-B' shown in FIG. 19.

Then, as shown in FIGS. 19 to 21, a cavity section 32 for forming a gate electrode is formed in such a way as to extend in the X-direction of the memory cell region R1 and have at least one end that reaches the embedded-word-line contact section R4 (See FIG. 1).

More specifically, after the previous process is completed, a resist film (not shown) is formed on the upper surfaces of the hard mask film 1 and insulating films such as the peripheral word interlayer insulation film 7b. The resist film that is provided in areas where the gate electrode and a connection portion thereof are to be formed is removed by patterning. After that, the remaining resist film is used as a mask, a photolithographic etching technique is used to dig exposed parts of the hard mask film 1, bit interlayer insulating film 7a, and peripheral word interlayer insulation film 7b. The etching depth of this process is set shallower than a position where the embedded cell bit lines 5a and the embedded peripheral bit lines 5b are formed.

Then, on the inner wall of the cavity section 32, the gate insulating film 12, which is made of silicon oxide film, is formed. The gate insulating film 12 can be formed by oxidizing the exposed inner wall of the cavity section 32 through thermal oxidation (ISSG). The gate insulating film 12 may be formed by CVD method.

Figure 22:
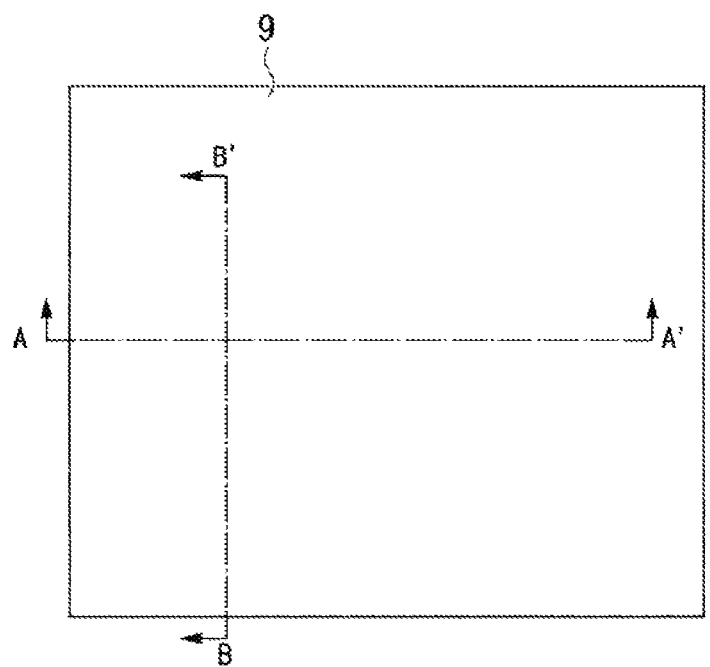
FIG. 22 is a plan view indicative of an embodiment of one process in the method of forming the semiconductor device according to the first embodiment of the present invention.
Figure 23:
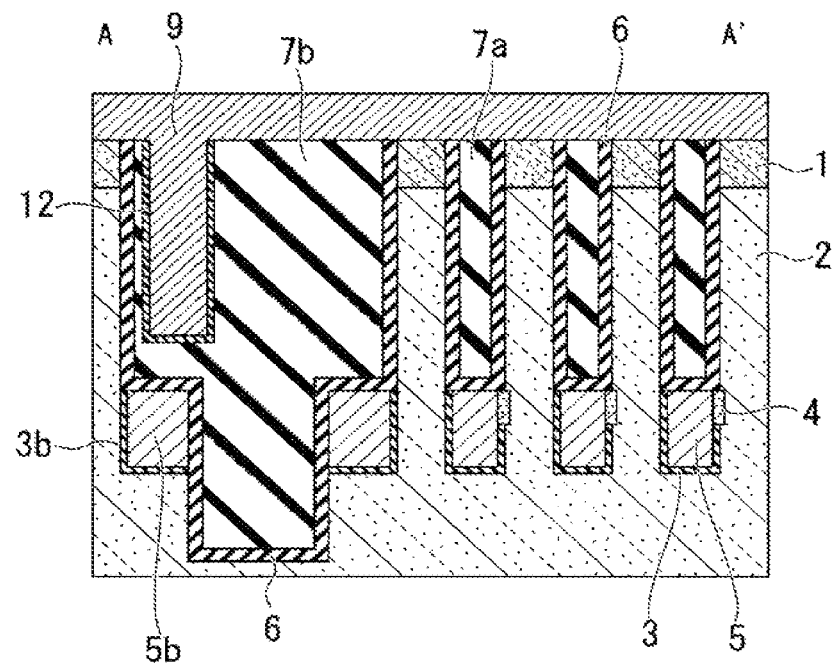
FIG. 23 is a sectional view taken along a line A-A' shown in FIG. 22.
Figure 24:
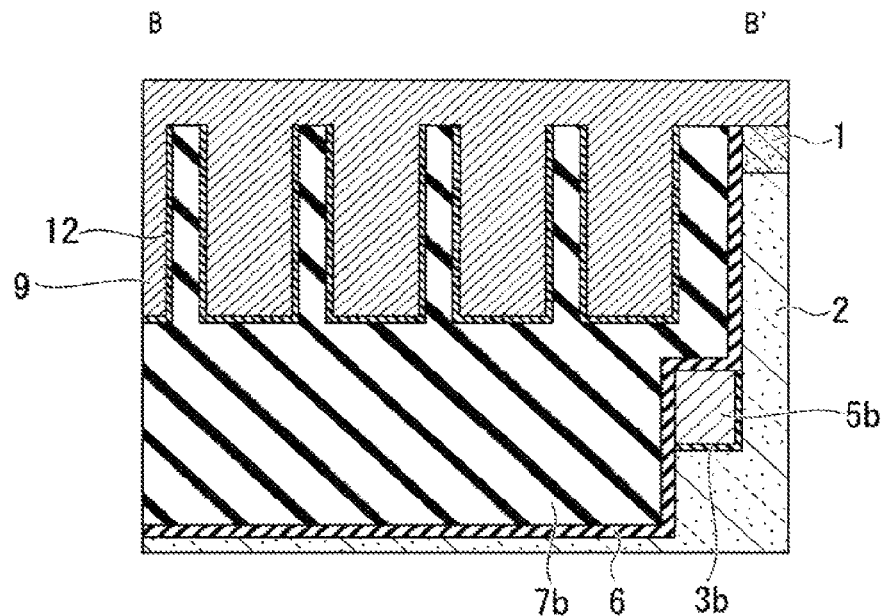
FIG. 24 is a sectional view taken along a line B-B' shown in FIG. 22.

Then, as shown in FIGS. 22 to 24, a conductive film 9, which is the material of gate electrodes, is formed so as to fill the cavity section 32 surrounded by the gate insulating film. 12, and to cover the hard mask film 1 on the semiconductor substrate 2, the bit interlayer insulating film 7a, and the peripheral word interlayer insulation film 7b. The conductive film. 9 can be formed by CVD method. The conductive film 9, which is the material of gate electrodes, may be made of tungsten (W), or an impurity-doped silicon that is doped with a n-type semiconductor, or the like.

Figure 25:
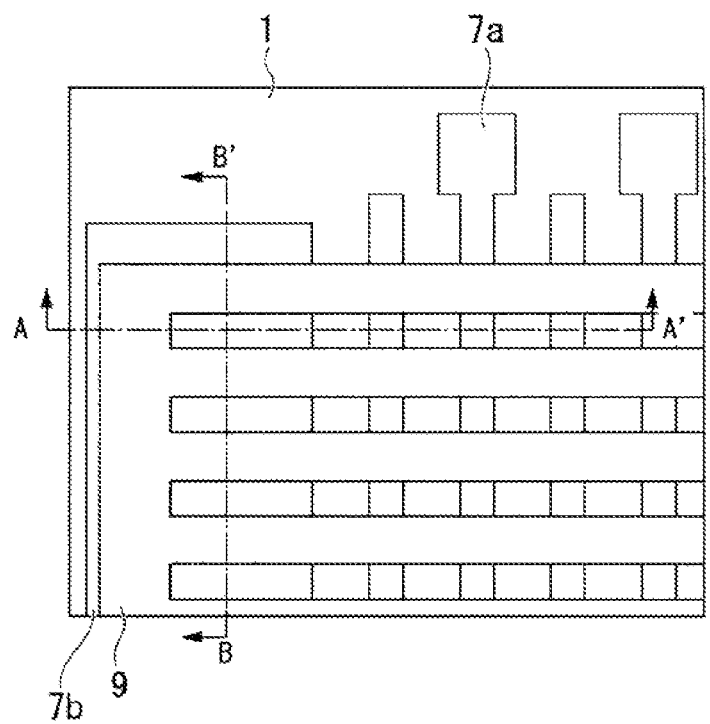
FIG. 25 is a plan view indicative of an embodiment of one process in the method of forming the semiconductor device according to the first embodiment of the present invention.
Figure 26:
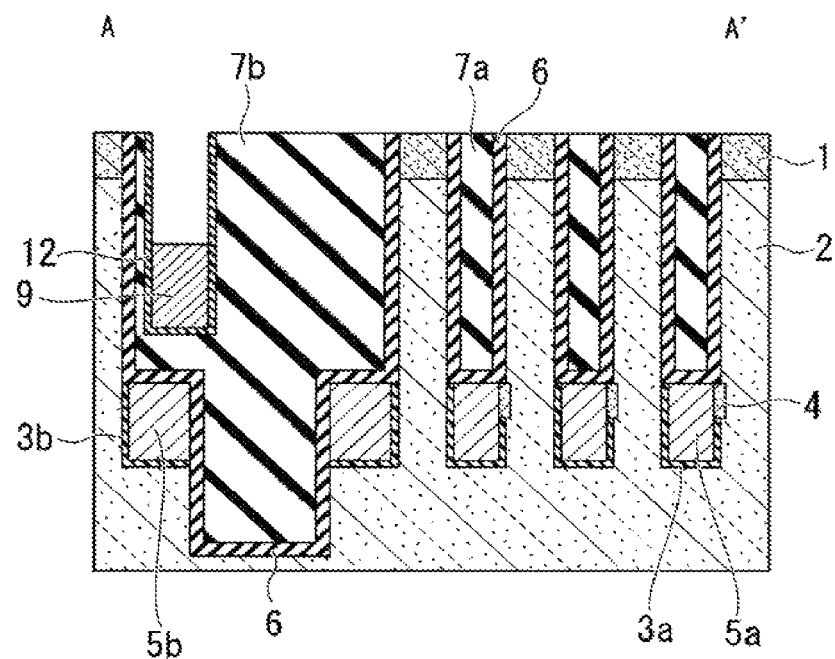
FIG. 26 is a sectional view taken along a line A-A' shown in FIG. 25.
Figure 27:
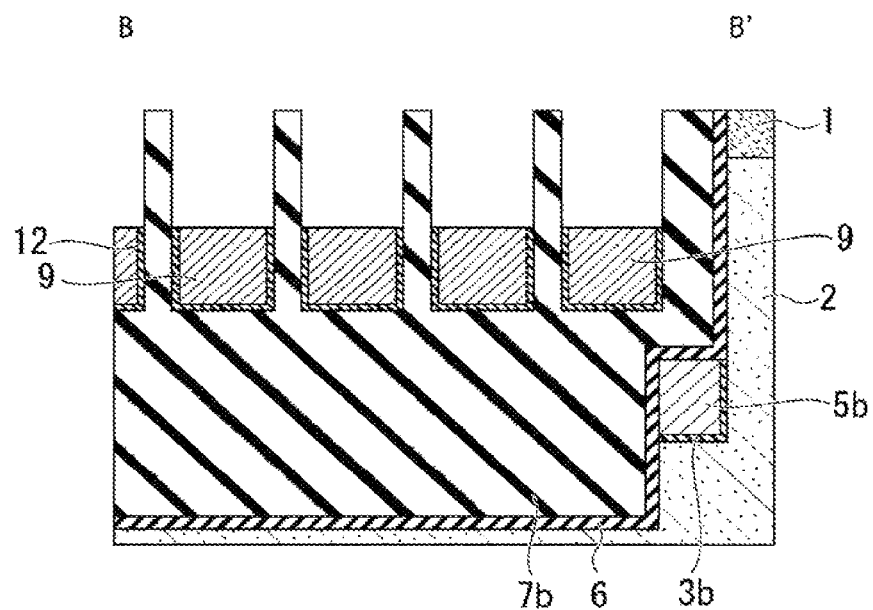
FIG. 27 is a sectional view taken along a line B-B' shown in FIG. 25.

Then, as shown in FIGS. 25 to 27, etching-back of the conductive film 9 and gate insulating film 12 is performed to form a conductive film 9 and gate insulating film 12 that are equal in height to a target gate electrode, in a bottom portion of the cavity section 32.

Figure 28:
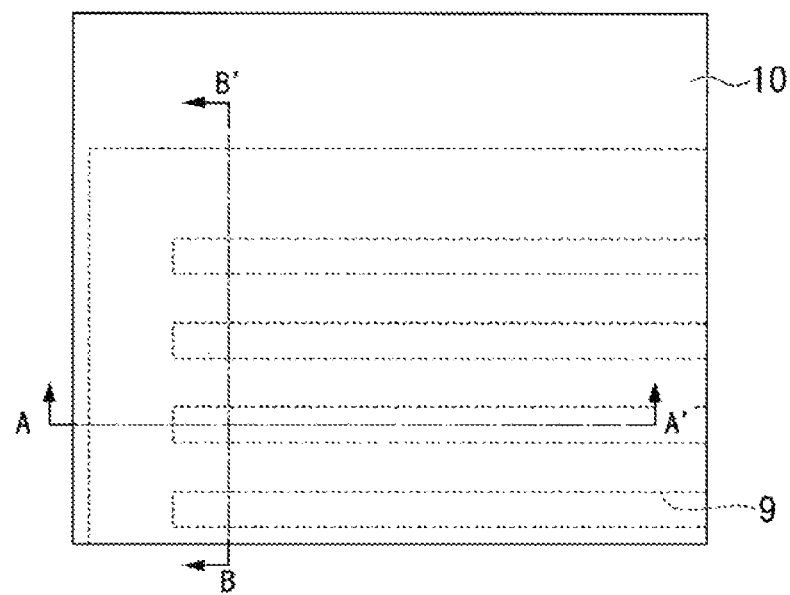
FIG. 28 is a plan view indicative of an embodiment of one process in the method of forming the semiconductor device according to the first embodiment of the present invention.
Figure 29:
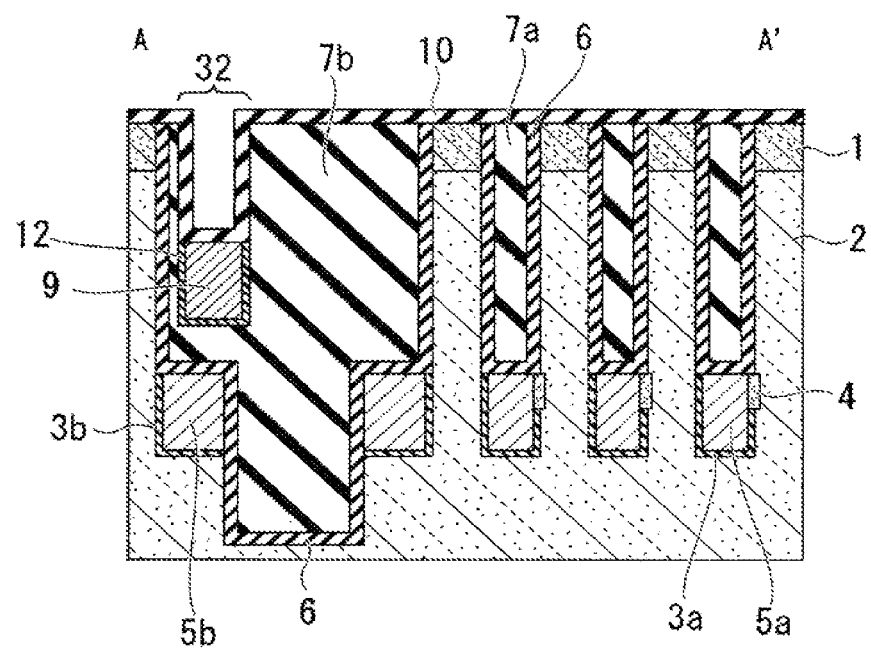
FIG. 29 is a sectional view taken along a line A-A' shown in FIG. 28.
Figure 30:
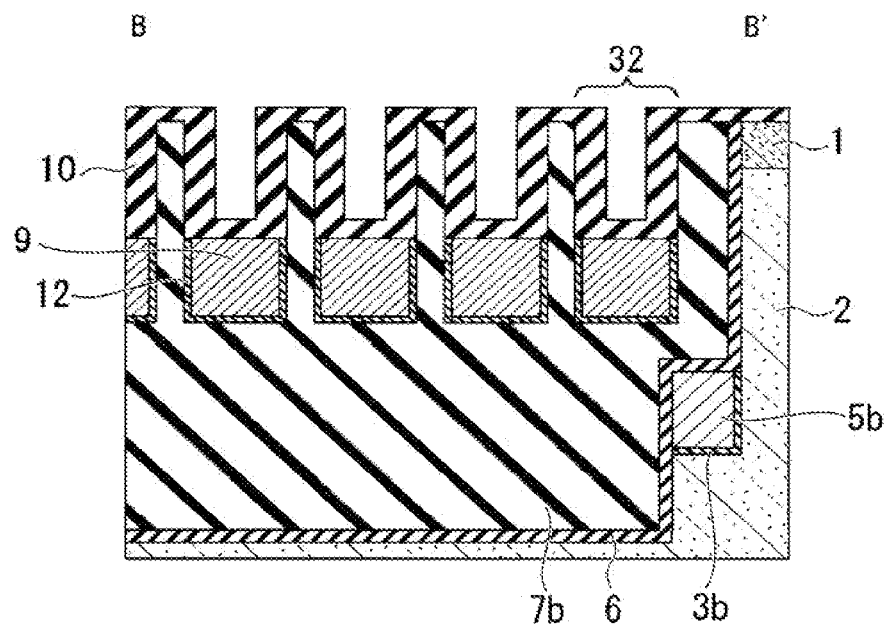
FIG. 30 is a sectional view taken along a line B-B' shown in FIG. 28.

Then, as shown in FIGS. 28 to 30, in a space above the conductive film 9 of the cavity section 32 and on the upper surfaces of the hard mask film 1, bit interlayer insulating film 7a, and peripheral word interlayer insulation film 7b on the semiconductor substrate 2, a sidewall film 10 of silicon oxide is formed so as not to completely fill the inside of the cavity section 32.

Figure 31:
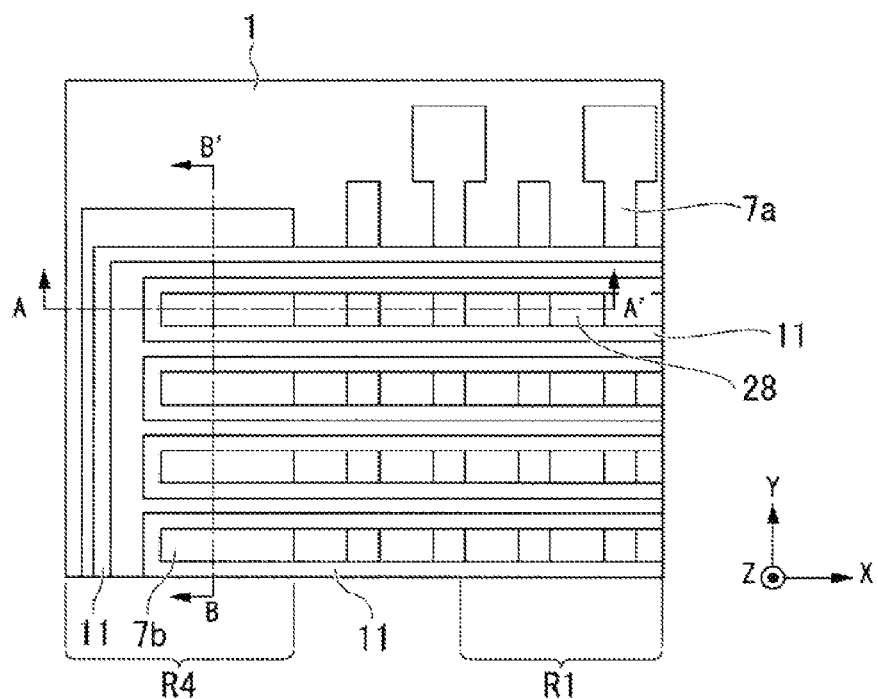
FIG. 31 is a plan view indicative of an embodiment of one process in the method of forming the semiconductor device according to the first embodiment of the present invention.
Figure 32:
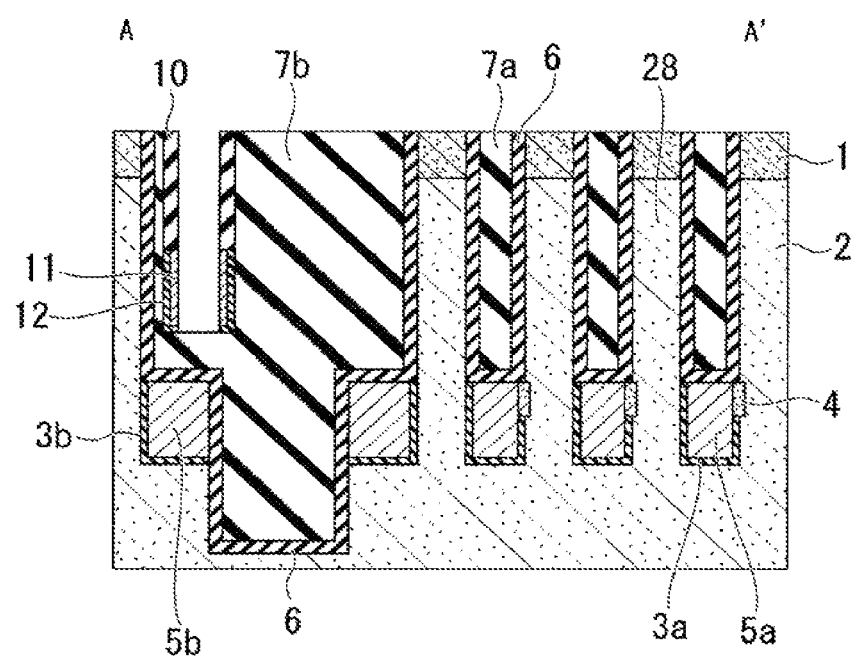
FIG. 32 is a sectional view taken along a line A-A' shown in FIG. 31.
Figure 33:
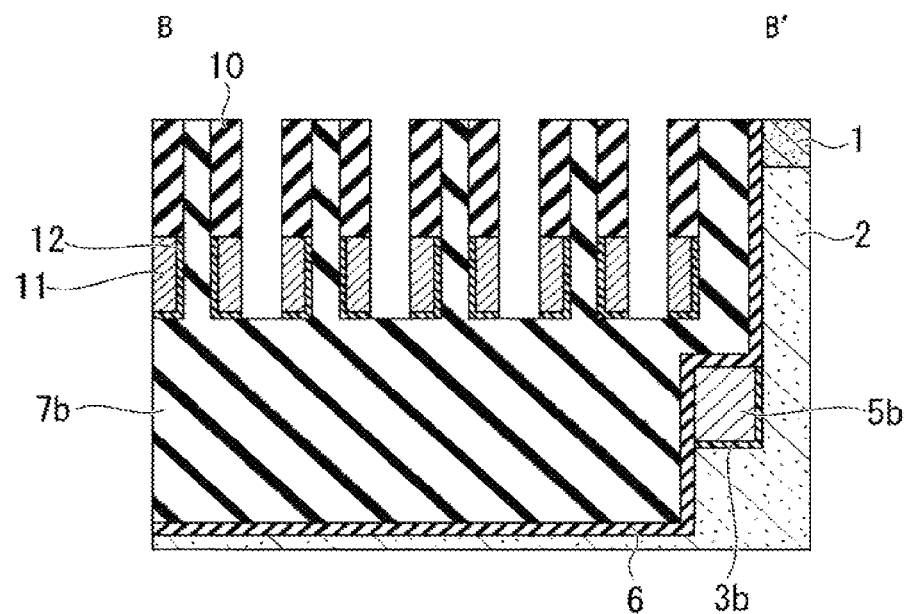
FIG. 33 is a sectional view taken along a line B-B' shown in FIG. 31.

Then, as shown in FIGS. 31 to 33, dry-etching-back of the conductive film 9 is performed by using the sidewall film 10 formed in the cavity section 32 as a mask. This process forms gate electrodes 11 that extend in the X-direction and are connected in the embedded-word-line contact section R4. Referring to FIG. 32, the gate electrodes 11 are provided above the embedded cell bit line 5a. Moreover, as shown in FIG. 31, the gate electrodes 11 formed are in contact with the silicon pillars 28 of the memory cell region R1. At this time, the gate electrodes 11 are provided as a pair on both side surfaces of a silicon pillar 28 that is parallel to the X-direction. The gate electrodes 11 are in contact with the silicon pillars 28 via the gate insulating film 12.

Then, the remaining sidewall film 10 is removed.

Then, the liner film 19 is formed in such a way as to cover the exposed surface of the cavity section 32. The liner film 19 may be made of a silicon oxynitride film, a silicon nitride film, or a laminated film of those films.

Figure 34:
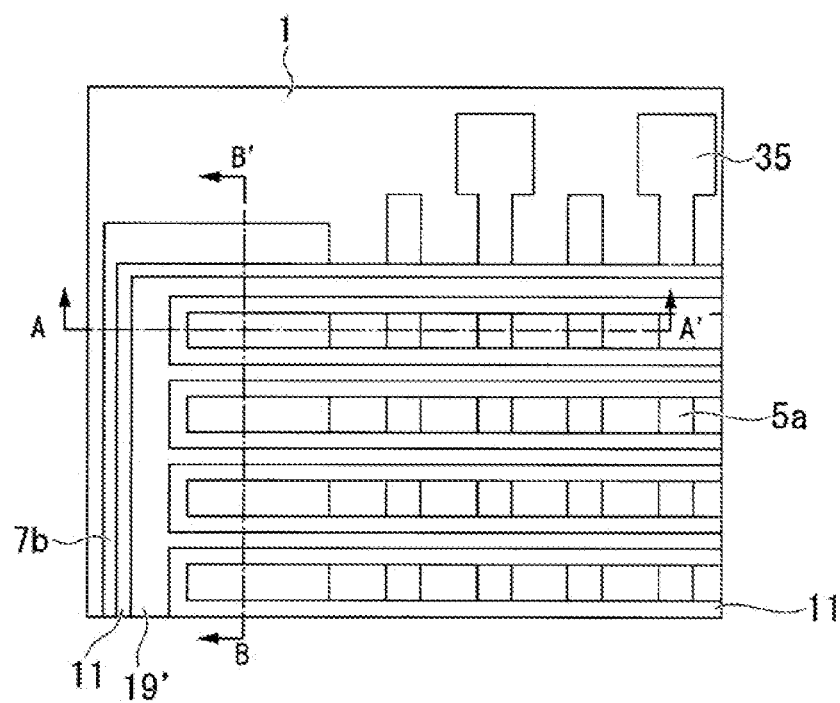
FIG. 34 is a plan view indicative of an embodiment of one process in the method of forming the semiconductor device according to the first embodiment of the present invention.
Figure 35:
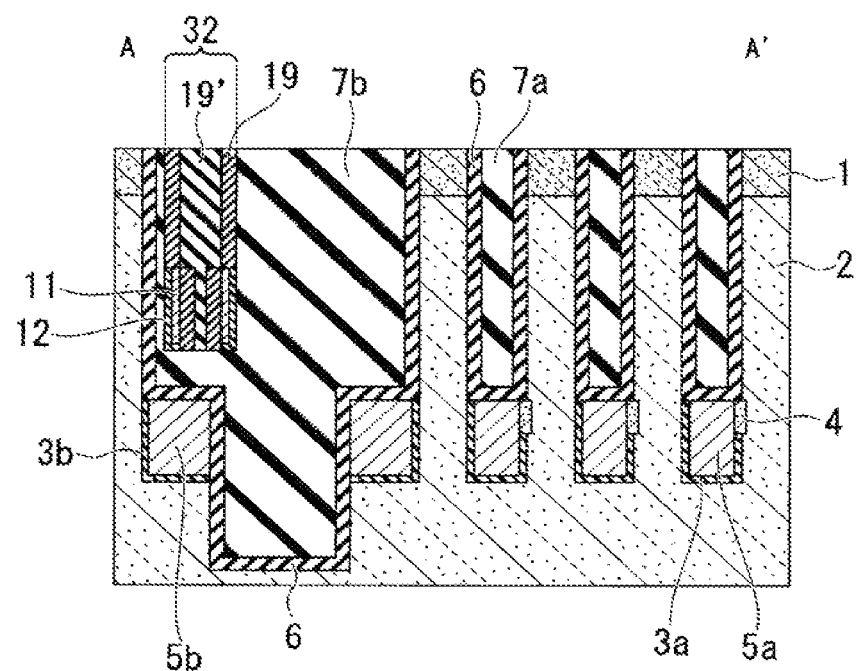
FIG. 35 is a sectional view taken along a line A-A' shown in FIG. 34.
Figure 36:
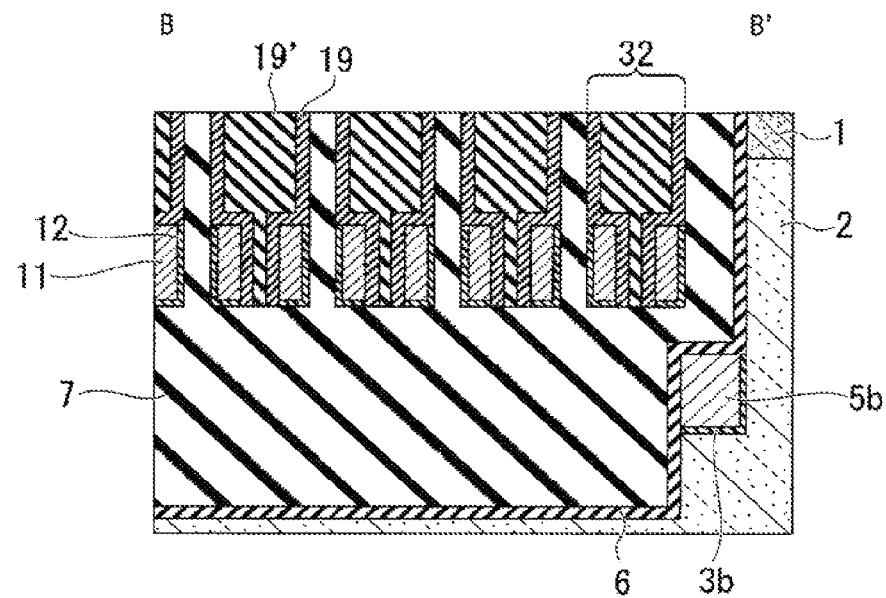
FIG. 36 is a sectional view taken along a line B-B' shown in FIG. 34.

Then, as shown in FIGS. 34 to 36, an insulating film is embedded in the space surrounded by the liner film 19 to form the word interlayer insulating film 19' in the cavity section 32. The insulating film used for forming the word interlayer insulating film 19' may be SOD film or HDP film of silicon oxide. After the liner film 19 and the word interlayer insulating film. 19' are formed, the upper portions of those insulating films may be polished and removed, if necessary, by CMP method until an upper surface of the hard mask film 1 on the semiconductor substrate 2 is exposed. In this manner, the upper surfaces of the hard mask film 1 and liner film. 19 and word interlayer insulating film. 19' are made flush with each other.

Figure 37:
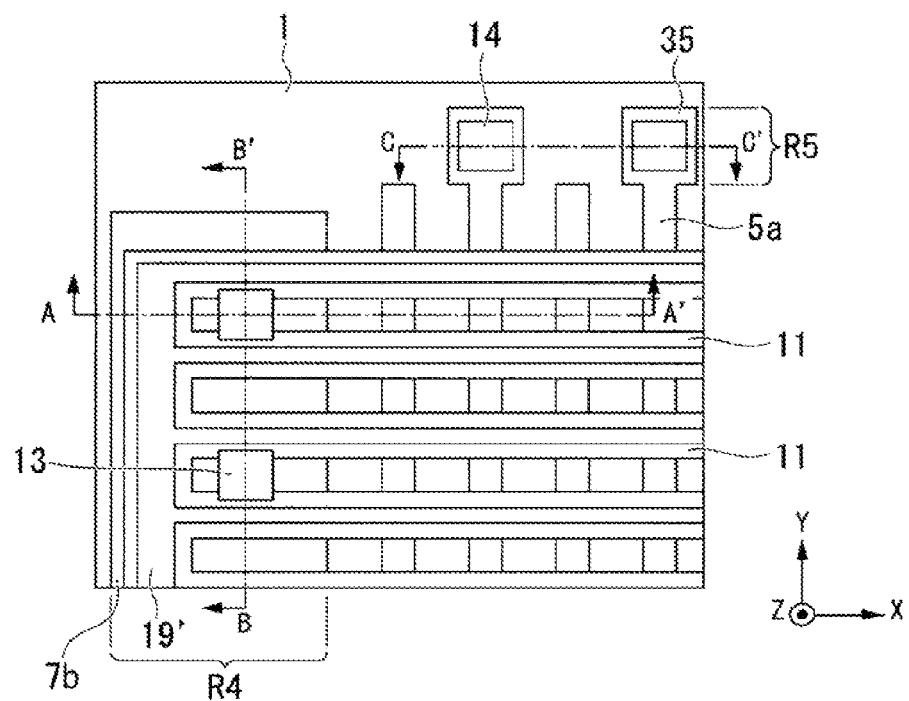
FIG. 37 is a plan view indicative of an embodiment of one process in the method of forming the semiconductor device according to the first embodiment of the present invention.

Then, on the upper surfaces of the hard mask film 1 and other interlayer insulating films that have been made flush with each other, a resist film (not shown) is formed. As shown in FIG. 37, the resist film in an area where the cell word line contact plug 13 is formed in the embedded-word-line contact section R4 and the resist film in an area where the cell bit line contact plug 14 is formed in the connection portion of the gate electrodes 11 of the bit line contact section R5 in such a way as to be sandwiched between the gate electrodes 11 are removed.

Then, dry-etching is performed by using the remaining resist film as a mask to form a cell bit line contact hole (not shown) and a cell word line contact hole (not shown) at once. At this time, conditions of etching are set in such a way that: the cell bit line contact hole formed in the embedded-word-line contact section R4 penetrates the peripheral bit interlayer insulation film; and a bottom surface thereof will come in contact with an upper surface of the enlarged end portion 35 of the embedded cell bit line 5a, or is provided inside the enlarged end portion 35 (See FIG. 40).

The cell word line contact hole is formed together with the cell bit line contact hole. Therefore, the cell word line contact hole is formed so as to be substantially equal in depth to the cell bit line contact hole, which means that the cell word line contact hole goes far deeper than a position where the gate electrodes 11 are formed. However, since the cell word line contact hole is formed within the insulating section R3 of the embedded-word-line contact section R4 that is deeper than the surrounding area, the cell word line contact hole is insulated from the semiconductor substrate 2. Moreover, the cell word line contact hole is formed so as to be embedded in the word interlayer insulating film 19'.

Incidentally, as shown in FIG. 37, the cell word line contact holes are preferably formed in the word interlayer insulating film 19' that is formed between the gate electrodes 11 in the embedded-word-line contact section R4 of one end in the X-direction, in such a way as to alternately appear in the Y-direction. At this time, as for the word interlayer insulating film 19' between the gate electrodes 11 where no cell word line contact hole is formed, a cell word line contact hole is formed in the word interlayer insulating film. 19' that is formed between the gate electrodes 11 in the embedded-word-line contact section R4 of the other end in the X-direction, (However, FIG. 37 only shows the embedded-word-line contact section R4 of the one end in the X-direction). Therefore, it is possible to prevent contact between the cell word line contact plugs 13, which are formed by the next process. However, this configuration may be unnecessary if the distance in the Y-direction between the gate electrodes 11 is sufficiently large.

Then, in the cell bit line contact hole and the cell word line contact hole, a conductive film for contact plugs are formed by CVD method or the like in such a way as to be embedded. The conductive film for contact plugs may be made of tungsten (W), or an impurity-doped silicon that is doped with a n-type semiconductor, or the like. If the conductive film is used, an upper portion of the contact-plug conductive film is polished and removed by CMP method after the contact-plug conductive film is embedded, and the semiconductor substrate 2 is exposed so as to be flush. As shown in FIGS. 37 to 40, this process forms the cell bit line contact plug 14 in the embedded-word-line contact section R4, and the cell word line contact plug 13 in the bit line contact section R5.

Figure 38:
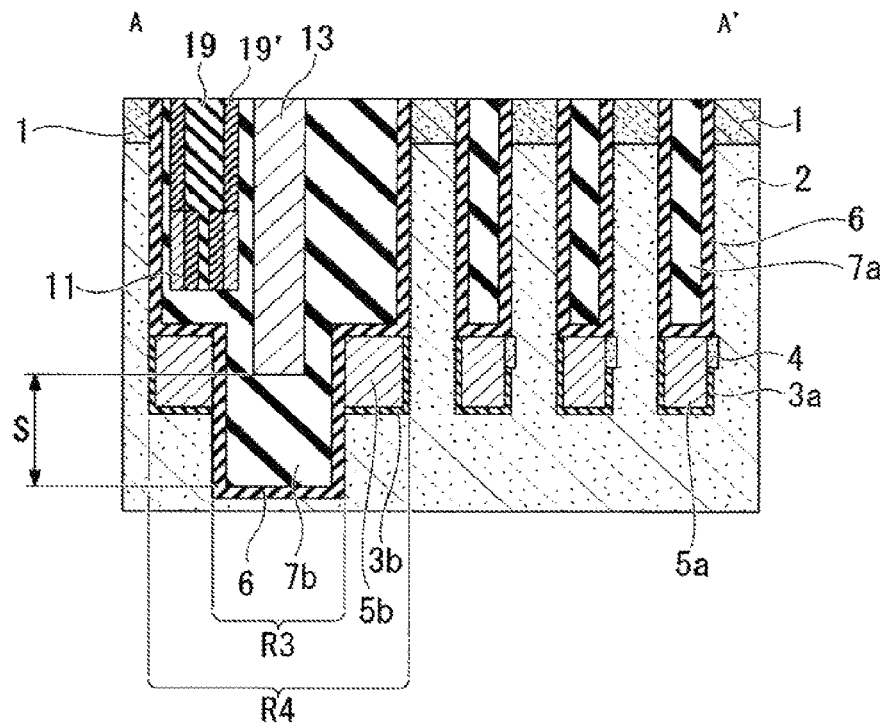
FIG. 38 is a sectional view taken along a line A-A' shown in FIG. 37.
Figure 39:
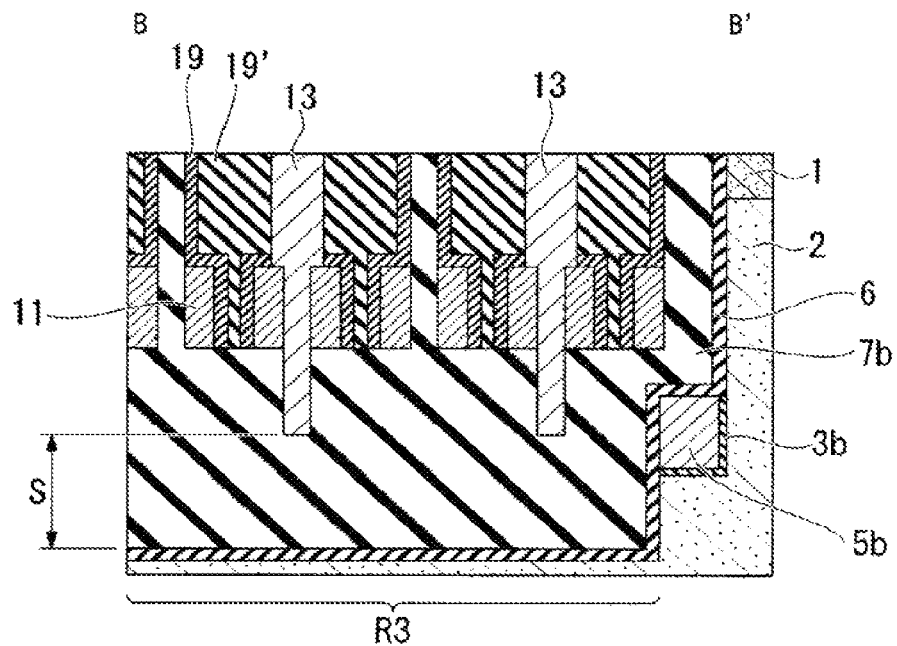
FIG. 39 is a sectional view taken along a line B-B' shown in FIG. 37.

As shown in FIGS. 38 and 39, the cell word line contact plug 13 is embedded in the insulating section R3 of the embedded-word-line contact section R4. That is, a side surface of the cell word line contact plug 13 is in contact with the word interlayer insulating film 19', the gate electrode 11, and the peripheral word interlayer insulation film 7b; a bottom surface thereof is in contact with the peripheral word interlayer insulation film 7b; and the cell word line contact plug 13 is insulated from the semiconductor substrate 2. A short margin during production of the semiconductor device is preferably taken into account in setting an insulation depth S, shown in FIG. 39, between the bottom surface of the cell word line contact plug 13 and a bottom surface of the insulating section R3.

Figure 40:
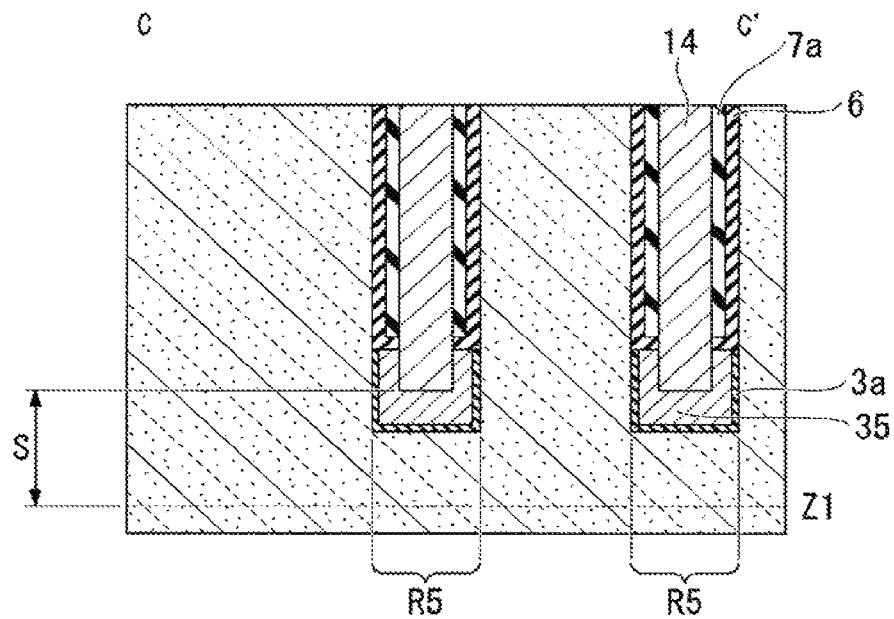
FIG. 40 is a sectional view taken along a line C-C' shown in FIG. 37.

Moreover, as shown in FIG. 40, the cell bit line contact plug 14 is embedded in the bit line contact section R5; a side surface thereof, except portions of the side surface in the bottom portion, is in contact with the bit interlayer insulating film 7a; and a bottom portion thereof is in contact with the enlarged end portion 35.

In the subsequent processes, the following components are formed: the impurity diffusion region 18 and capacitor 24 of the memory cell region R1 shown in FIGS. 1 and 2; the bit line upper wire 15a and the word line upper wire 15b; and the upper interlayer insulating film 38. Incidentally, those components are not necessarily formed in the order described below; the order may be changed.

A portion of the exposed hard mask film 1 on which a capacitor is to be formed in the memory cell region R1 is removed and the impurity diffusion region 18 is formed in the removed portion. The impurity diffusion region 18 may be formed by embedding an impurity-doped silicon that is doped with n-type impurities such as arsenic or phosphorus after the hard mask film 1 is removed; or the impurity diffusion region 18 may be formed by embedding a polysilicon film after removal of the hard mask film 1 and implanting n-type-semiconductor ions from above the polysilicon film.

By this process, the impurity diffusion regions 18 that function as a capacitor contact plug are formed on the silicon pillars 28.

Then, on the semiconductor substrate 2, the upper interlayer insulating film 38, which is made of a silicon oxide film or the like and has a predetermined height necessary to form the bit line upper wire 15a and the word line upper wire 15b, is formed. On the upper interlayer insulating film 38, a resist film (not shown) is formed. Patterning is performed to remove the resist film above the cell word line contact plug 13 and cell bit line contact plug 14. Patterning of the upper interlayer insulating film 38 is performed by using the remaining resist film as a mask to expose the upper surfaces of the cell word line contact plug 13 and cell bit line contact plug 14. After this, a contact-plug conductive film is embedded above the cell word line contact plug 13 and cell bit line contact plug 14, so that, as shown in FIGS. 2 and 3, the cell word line contact plug 13 and the cell bit line contact plug 14 extend upward. The upper surface of the contact-plug conductive film is polished and removed by CMP method when necessary, so that the upper surfaces of the cell word line contact plug 13 and cell bit line contact plug 14 are flush with the upper surface of the upper interlayer insulating film 38.

Then, a conductive film for upper wires, which is made of aluminum (Al) or copper (Cu), is formed in such a way as to cover the cell word line contact plug 13 and the cell bit line contact plug 14 and the upper interlayer insulating film 38. Patterning of the upper-wire conductive film is performed to form the bit line upper wire 15a and the word line upper wire 15b on the cell bit line contact plug 14 and the cell word line contact plug 13, respectively. As shown in FIG. 1, the bit line upper wire 15a and the word line upper wire 15b may be made in such a way as to extend from the DRAM 200. In such a case, those wires may be connected to external circuits or the like of the DRAM 200.

Then, an insulating film, which is made of silicon oxide film or the like, is formed on whole surface of the memory cell region R1 and peripheral circuit region R10 in such a way that the bit line upper wire 15a and the word line upper wire 15b are embedded. Suppose that this insulating film is made of the same material as the upper interlayer insulating film 38. In FIGS. 2 and 3, the formed silicon oxide films are shown as the upper interlayer insulating film 38.

Then, on the upper interlayer insulating film 38, a resist film (not shown) is formed. Patterning is performed to remove the resist film above the impurity diffusion region 18 of the memory cell region R1, and patterning of the upper interlayer insulating film 38 is performed. As a result, an upper surface of the impurity diffusion region 18 is exposed, and a capacitor hole (not shown) for forming a capacitor is formed. Then, as shown in FIG. 2, a conductive film such as impurity-doped silicon is embedded in the capacitor hole, thereby forming the capacitor 24. In FIG. 2, the cylinder-type capacitor 24 is illustrated. However, the capacitor 24 is not limited to the cylinder type; a crown type, a fin type, or any other type is available for the capacitor 24 as long as those types can be applied to DRAMs.

The DRAM 200 is made by the above-described processes.

According to the forming method of the semiconductor device of the present embodiment, the cell word line contact plug 13 and the cell bit line contact plug 14 can be formed at once in such a way as to go deeper into the semiconductor substrate 2 than the gate electrodes 11 that can come in contact with the enlarged end portion 35 of the embedded cell bit line 5a, and to be equal in depth. At this time, the cell word line contact plug 13 is formed far deeper than the gate electrodes 11. However, the cell word line contact plug 13 is embedded in the peripheral word interlayer insulation film 7b that is formed in the insulating section R3 located deeper than the surrounding area of the embedded-word-line contact section R4. Accordingly, the bottom surface of the cell word line contact plug 13 does not touch the semiconductor substrate 2; a sufficient insulation distance therefore can be ensured between the cell word line contact plug 13 and the semiconductor substrate 2. Therefore, it is possible to reliably prevent short-circuiting of the cell word line contact plug 13 and the semiconductor substrate 2.

The present invention has been described in detail by examples. However, the present invention is not limited to the examples. For example, as the configuration of an embedded bit line, what is described in the present example is a structure containing the cell bit line 5a and the cell bit contact 4 that is provided on a side surface of the bit line 5a, as shown in FIG. 2. However, the present invention can be applied without being limited to that configuration. For example, an embedded bit line 10 that includes a diffusion layer 25 as shown in FIGS. 1C, 7B, and 8B of U.S. Patent Application Publication NO. US2011/0215391 may be applied to the present invention. If this technique is applied to the present invention, for example, a bit line 5a is formed by introducing impurities into the bottom surfaces of the cavity sections 40a, 40b, and 40c shown in FIG. 8. A mask may be used to inject the impurities only into the cavity sections 40a and 40c. Moreover, in order to form the cavity 40b, the contact section R4 may be selectively etched in such a way that the bottom surface of the cavity section 40b of the peripheral circuit region R10 goes deeper than the bottom surface of the cavity section 40a of the memory cell region R1. If this technique is used, the bottom surface of the insulating film 7b covering the cell word line contact plug 13 can be deeper than the bottom surface of the bit line 5a. As a result, even in this modified example, it is possible to prevent short-circuiting of the contact plug 13 and the semiconductor substrate 2.

What is claimed is:

1. A semiconductor device comprising:
   a semiconductor substrate;
   insulating material in the semiconductor substrate;
   a gate electrode line buried in the semiconductor substrate, the gate electrode line being elongated to have an end portion that terminates in the insulating material; and
   a conductive plug formed in the insulating material in contact with a part of the end portion of the gate electrode line and in depth that is larger than the end portion of the gate electrode line.

2. The semiconductor device of claim 1 wherein the part of the end portion of the gate electrode line is a top surface and a side surface of the end portion of the gate electrode line.

3. The semiconductor device of claim 1 wherein,
   the conductive plug comprises an end in contact with the insulating material beneath the gate electrode line; and
   the insulating material comprises a first portion having a first width in a horizontal direction beneath the end of the contact plug and a second portion having a second width wider than the first width in the horizontal direction above the end of the contact plug.

4. The semiconductor device of claim 1 wherein the gate electrode line is a first gate electrode line, the semiconductor device further comprising:
   a second gate electrode line buried in the semiconductor substrate and elongated to have an end portion that terminates in the insulating material, the conductive plug being in contact with a part of the end portion of the second gate electrode line and in depth that is larger than the end portion of the second gate electrode line.

5. The semiconductor substrate of claim 4 wherein the part of the end portion of the second gate electrode line is a top surface and a side surface of the end portion of the second gate electrode line.

6. The semiconductor device of claim 1 wherein the semiconductor substrate comprises a cavity shallower than the insulating material.

7. The semiconductor device of claim 6 further comprising an insulating layer in the cavity.

8. The semiconductor device of claim 1 wherein the gate electrode line overlaps the cavity.

9. A semiconductor device comprising:
   a semiconductor substrate comprising a first cavity and a plurality of second cavities, each of the plurality of second cavities being shallower than the first cavity;
   a first insulating layer in the first cavity;
   a second insulating layer in the plurality of second cavities;
   a gate electrode line buried in the semiconductor substrate, the gate electrode line being elongated to have an end portion that terminates in the first insulating layer;
   a third insulating layer over the gate electrode line and in the first cavity;
   a conductive wire formed over the semiconductor substrate; and
   a contact plug provided to electrically connect the conductive wire and the gate electrode line, to penetrate the second insulating layer and be in contact with a part of the end portion of the gate electrode line, the contact plug being larger in depth than the end portion of the gate electrode line.

10. The semiconductor device of claim 9 wherein the part of the end portion of the gate electrode line is a top surface and a side surface of the gate electrode line.

11. The semiconductor device of claim 10 wherein,
    the contact plug comprises an end contacted with the first insulating layer beneath the gate electrode line; and
    the first insulating layer comprises a first portion having a first width in a horizontal direction beneath the end of the contact plug and a second portion having a second width wider than the first width in the horizontal direction above the end of the contact plug.

12. The semiconductor device of claim 9 wherein the gate electrode line is a first gate electrode line, the semiconductor device further comprising:
    a second gate electrode line buried in the semiconductor substrate and elongated to have an end portion that terminates in the first insulating layer, the conductive plug being in contact with a part of the end portion of the second gate electrode line and in depth that is larger than the end portion of the second gate electrode line.

13. The semiconductor device of claim 9 wherein the first and second gate electrode lines overlap the plurality of second cavities.

14. A semiconductor device comprising:
    a semiconductor substrate comprising a cavity;
    a first insulating layer in the cavity;
    a first gate electrode line buried in the semiconductor substrate, the first gate electrode line being elongated to have an end portion that terminates in the first insulating layer;
    a second gate electrode line buried in the semiconductor substrate, the second gate electrode line being elongated to have an end portion that terminates in the first insulating layer, the first and second gate electrode lines extending parallel to each other;
    a second insulating layer over the first and second gate electrode lines and in the cavity;
    a first conductive wire over the semiconductor substrate;
    a second conductive wire over the semiconductor substrate;
    a first contact plug provided to electrically connect the first conductive wire and the first gate electrode line, to penetrate the second insulating layer and be in contact with a part of the end portion of the first gate electrode line, the first contact plug being larger in depth than the end portion of the first gate electrode line; and
    a second contact plug provided to electrically connect the second conductive wire and the second gate electrode line, to penetrate the second insulating layer and be in contact with a part of the end portion of the second gate electrode line, the second contact plug being larger in depth than the end portion of the second gate electrode line.

15. The semiconductor device of claim 14 wherein the part of the end portion of the first and second lines is a top surface and a side surface of the end portion of the first and second gate electrode lines, respectively.

16. The semiconductor device of claim 14 further comprising:
    a third gate electrode line buried in the semiconductor substrate and elongated to have an end portion that terminates in the first insulating layer, the third gate electrode line extending parallel with the first gate electrode line between the first and second gate electrode lines, the end portion of the third gate electrode line being located at a portion where no contact is provided on a straight line joining between the first and second contact plugs.

17. The semiconductor device of claim 14 wherein the first contact plug comprises an end contacted with the first insulating layer beneath the first gate electrode line and the second contact plug comprises an end contacted with the first insulating layer beneath the second gate electrode line.

18. The semiconductor device of claim 14 wherein,
the cavity is a first cavity; and
the semiconductor substrate comprises a second cavity shallower than the first cavity.

19. The semiconductor device of claim 18 further comprising a third insulating layer in the second cavity.

20. The semiconductor device of claim 18 wherein the first and second gate electrode lines overlap the second cavity.

* * * * *